United States Patent
Hada et al.

(10) Patent No.: US 10,224,340 B2
(45) Date of Patent: Mar. 5, 2019

(54) THREE-DIMENSIONAL MEMORY DEVICE HAVING DISCRETE DIRECT SOURCE STRAP CONTACTS AND METHOD OF MAKING THEREOF

(71) Applicant: SANDISK TECHNOLOGIES LLC, Plano, TX (US)

(72) Inventors: Tsuyoshi Hada, Yokkaichi (JP); Satoshi Shimizu, Yokkaichi (JP); Kazuyo Matsumoto, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/626,444

(22) Filed: Jun. 19, 2017

(65) Prior Publication Data
US 2018/0366486 A1    Dec. 20, 2018

(51) Int. Cl.
| | |
|---|---|
| H01L 29/792 | (2006.01) |
| H01L 27/11582 | (2017.01) |
| H01L 27/1157 | (2017.01) |
| H01L 27/11524 | (2017.01) |
| H01L 27/11556 | (2017.01) |

(52) U.S. Cl.
CPC .... *H01L 27/11582* (2013.01); *H01L 27/1157* (2013.01); *H01L 27/11524* (2013.01); *H01L 27/11556* (2013.01)

(58) Field of Classification Search
CPC ........ H01L 27/11524; H01L 27/11556; H01L 27/1157; H01L 27/11582; H01L 29/42328
USPC ...................................................... 257/324
See application file for complete search history.

(56) References Cited

U.S. PATENT DOCUMENTS

| | | |
|---|---|---|
| 5,915,167 A | 6/1999 | Leedy |
| 7,005,350 B2 | 2/2006 | Walker et al. |
| 7,023,739 B2 | 4/2006 | Chen et al. |
| | (Continued) | |

FOREIGN PATENT DOCUMENTS

| | | |
|---|---|---|
| JP | 2015149413 A | 8/2015 |
| WO | WO 2002/015277 A2 | 2/2002 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Jay C Kim
(74) *Attorney, Agent, or Firm* — The Marbury Law Group PLLC

(57) ABSTRACT

A planar material layer stack including a lower etch stop dielectric layer, a sacrificial semiconductor layer, and an upper etch stop dielectric layer is formed over a source semiconductor layer on a substrate. An alternating stack of insulating layers and spacer material layers is formed. The spacer material layers are formed as, or are subsequently replaced with, electrically conductive layers. An array of memory stack structures is formed. A source cavity is formed by removing the sacrificial semiconductor layer and portions of the memory films. Source strap structures are formed by a selective semiconductor deposition process on the vertical semiconductor channels and the source semiconductor layer. A dielectric fill material layer fills a remaining volume of the source cavity.

13 Claims, 22 Drawing Sheets

(56) References Cited

U.S. PATENT DOCUMENTS

| | | | |
|---|---|---|---|
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,295,091 B2 * | 10/2012 | Itagaki | G11C 16/0483 365/185.02 |
| 8,394,716 B2 | 3/2013 | Hwang et al. | |
| 8,872,183 B2 * | 10/2014 | Chang | H01L 21/8221 257/324 |
| 8,969,940 B1 * | 3/2015 | Yater | H01L 29/42328 257/314 |
| 8,987,805 B2 * | 3/2015 | Nam | H01L 29/7926 257/324 |
| 9,230,980 B2 * | 1/2016 | Rabkin | G11C 16/0483 |
| 9,305,937 B1 * | 4/2016 | Tsutsumi | H01L 27/11582 |
| 9,379,134 B2 * | 6/2016 | Lee | H01L 27/11582 |
| 9,455,263 B2 | 9/2016 | Zhang et al. | |
| 9,472,569 B2 * | 10/2016 | Lee | H01L 27/11582 |
| 9,484,357 B2 * | 11/2016 | Makala | H01L 27/11582 |
| 9,508,737 B2 * | 11/2016 | Kim | H01L 27/11582 |
| 9,548,313 B2 | 1/2017 | Yada et al. | |
| 9,570,462 B2 * | 2/2017 | Lee | H01L 27/11582 |
| 9,576,971 B2 * | 2/2017 | Zhang | H01L 27/11582 |
| 9,601,508 B2 * | 3/2017 | Sel | H01L 29/04 |
| 9,601,577 B1 * | 3/2017 | Lee | H01L 27/11578 |
| 9,613,977 B2 * | 4/2017 | Sharangpani | H01L 27/11582 |
| 9,627,405 B1 * | 4/2017 | Lee | H01L 27/1158 |
| 9,646,975 B2 * | 5/2017 | Peri | H01L 27/115 |
| 9,653,562 B2 * | 5/2017 | Kim | H01L 27/11556 |
| 9,698,152 B2 * | 7/2017 | Peri | H01L 27/1157 |
| 9,716,105 B1 * | 7/2017 | Tsutsumi | H01L 21/02326 |
| 9,754,956 B2 * | 9/2017 | Tsutsumi | H01L 27/11582 |
| 9,754,958 B2 * | 9/2017 | Pachamuthu | H01L 27/11582 |
| 9,768,185 B2 * | 9/2017 | Akutsu | H01L 21/76889 |
| 9,768,192 B1 * | 9/2017 | Nakamura | H01L 27/1157 |
| 9,831,265 B2 * | 11/2017 | Kim | H01L 27/1157 |
| 9,842,851 B2 * | 12/2017 | Pachamuthu | H01L 27/11582 |
| 9,847,346 B2 * | 12/2017 | Lee | H01L 27/11565 |
| 9,881,931 B2 * | 1/2018 | Lee | H01L 27/11565 |
| 9,899,408 B2 * | 2/2018 | Son | H01L 27/1157 |
| 9,929,179 B2 * | 3/2018 | Son | H04L 1/1812 |
| 9,978,771 B2 * | 5/2018 | Hwang | H01L 27/11582 |
| 9,985,098 B2 * | 5/2018 | Matsumoto | H01L 27/11524 |
| 9,997,534 B2 * | 6/2018 | Son | H01L 27/11582 |
| 2007/0210338 A1 | 9/2007 | Orlowski | |
| 2007/0252201 A1 | 11/2007 | Kito et al. | |
| 2009/0230449 A1 | 9/2009 | Sakaguchi et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0086072 A1 * | 4/2012 | Yun | H01L 27/11578 257/329 |
| 2012/0119287 A1 | 5/2012 | Park et al. | |
| 2012/0199897 A1 | 9/2012 | Chang et al. | |
| 2013/0168757 A1 | 7/2013 | Hong | |
| 2013/0248974 A1 | 9/2013 | Alsmeier et al. | |
| 2013/0264631 A1 | 10/2013 | Alsmeier et al. | |
| 2015/0060977 A1 * | 3/2015 | Lee | H01L 29/7926 257/314 |
| 2015/0149413 A1 | 5/2015 | Lee et al. | |
| 2015/0162342 A1 | 6/2015 | Lee et al. | |
| 2015/0179660 A1 | 6/2015 | Yada et al. | |
| 2016/0071881 A1 | 3/2016 | Lee et al. | |
| 2016/0240552 A1 * | 8/2016 | Arai | H01L 27/11582 |
| 2016/0351582 A1 * | 12/2016 | Kim | H01L 27/1157 |
| 2016/0365352 A1 | 12/2016 | Nishikawa et al. | |
| 2017/0084618 A1 | 3/2017 | Peri et al. | |
| 2017/0125438 A1 | 5/2017 | Pachamuthu et al. | |
| 2017/0148800 A1 * | 5/2017 | Nishikawa | H01L 27/1157 |
| 2017/0263620 A1 * | 9/2017 | Lee | H01L 27/11565 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

International Application No. PCT/US2016/049986, Invitation to Pay Additional Fees, dated Dec. 22, 2016, 8pgs.

International Application No. PCT/US2016/062528, Invitation to Pay Additional Fees, dated Feb. 3, 2017, 8pgs.

U.S. Appl. No. 15/017,961, filed Feb. 8, 2016, SanDisk Technologies LLC.

U.S. Appl. No. 15/225,492, filed Aug. 1, 2016, SanDisk Technologies LLC.

U.S. Appl. No. 15/354,116, filed Nov. 17, 2016, SanDisk Technologies LLC.

U.S. Appl. No. 15/458,200, filed Mar. 14, 2017, SanDisk Technologies LLC.

U.S. Appl. No. 15/458,269, filed Mar. 14, 2017, SanDisk Technologies LLC.

U.S. Appl. No. 15/458,272, filed Mar. 14, 2017, SanDisk Technologies LLC.

International Search Report and Written Opinion of the International Searching Authority for International Patent Application No. PCT/US2018/019639, dated May 15, 2018, 14 pages.

* cited by examiner

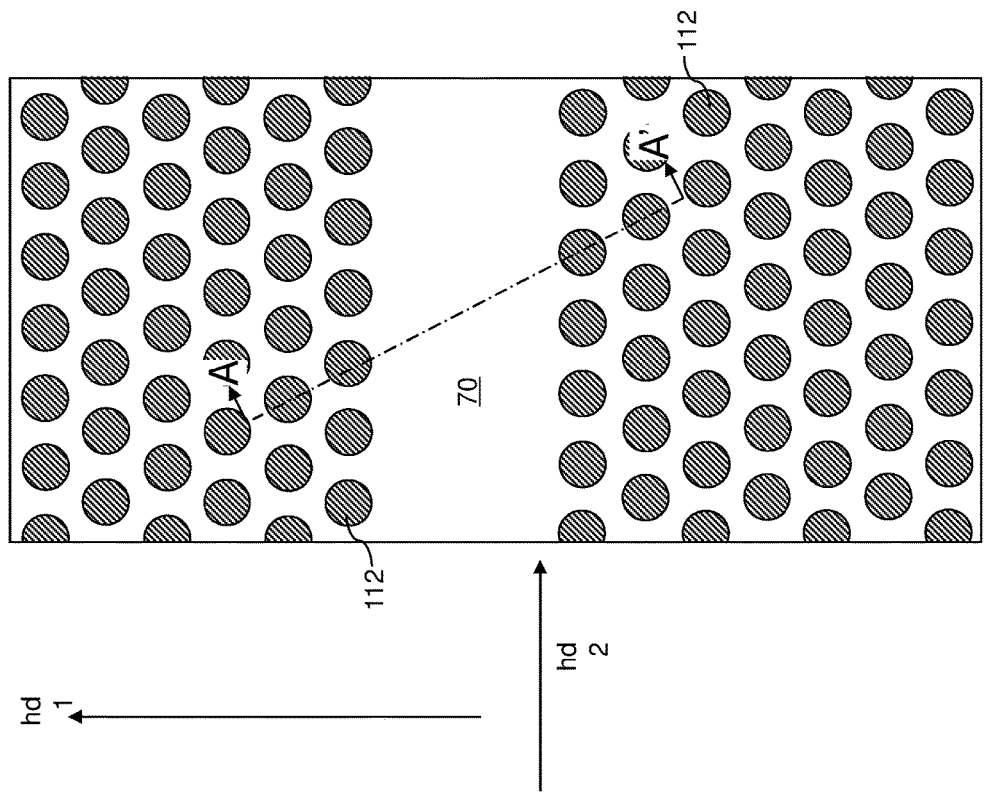

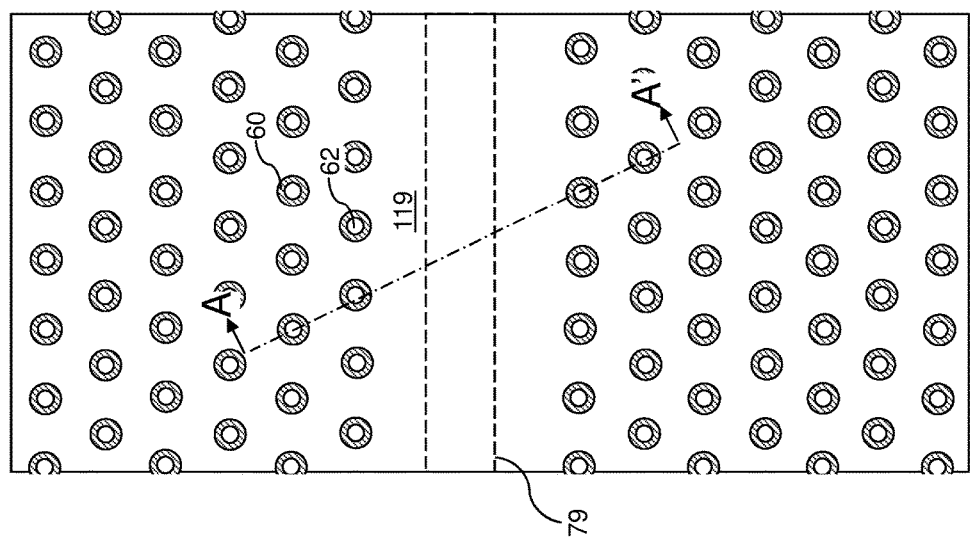

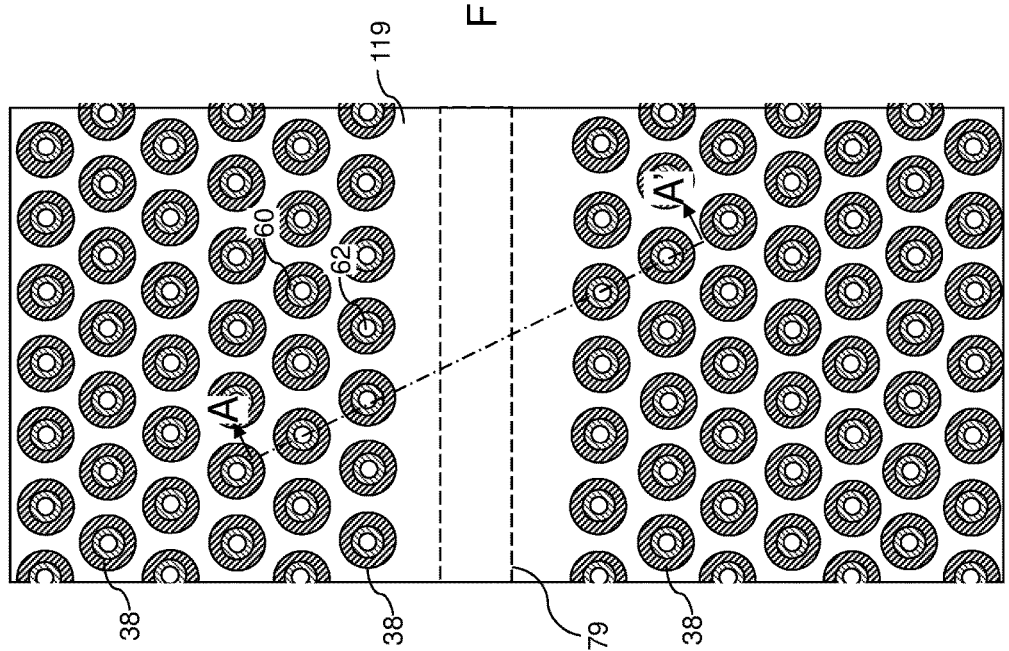

THREE-DIMENSIONAL MEMORY DEVICE HAVING DISCRETE DIRECT SOURCE STRAP CONTACTS AND METHOD OF MAKING THEREOF

FIELD

The present disclosure relates generally to the field of semiconductor devices and specifically to a three-dimensional memory structure employing discrete source straps for providing direct source contact to vertical semiconductor channels and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a source semiconductor layer comprising a doped semiconductor material and located over a substrate; a dielectric material layer stack overlying the source semiconductor layer and comprising, from bottom to top, a lower etch stop dielectric layer, a dielectric fill material layer, and an upper etch stop dielectric layer; an alternating stack of electrically conductive layers and insulating layers located over the dielectric material layer stack; an array of memory stack structures that extend through the alternating stack and into an upper portion of the source semiconductor layer, each memory stack structure including a vertical semiconductor channel and a memory film laterally surrounding the vertical semiconductor channel, wherein a bottom end of each memory film terminates above a horizontal plane including a top surface of the upper etch stop dielectric layer; and discrete source strap structures contacting, and laterally surrounding, a respective one of the vertical semiconductor channels of the memory stack structures and contacting the source semiconductor layer.

According to another aspect of the present disclosure, a method of forming a three-dimensional memory device is provided. A planar material layer stack is formed over a source semiconductor layer on a substrate. The planar material layer stack comprises, from bottom to top, a lower etch stop dielectric layer, a sacrificial semiconductor layer, and an upper etch stop dielectric layer. An alternating stack of insulating layers and spacer material layers is formed over the planar material layer stack, wherein the spacer material layers are formed as, or are subsequently replaced with, electrically conductive layers. An array of memory stack structures that extend through the alternating stack and into an upper portion of the source semiconductor layer is formed. Each memory stack structure includes a semiconductor channel and a memory film laterally surrounding the vertical semiconductor channel. A source cavity is formed by removing the sacrificial semiconductor layer and portions of the memory films at a level of the planar material layer stack selective to the upper and lower etch stop dielectric layers. Source strap structures are formed around a respective one of the vertical semiconductor channels and on physically exposed surfaces of the source semiconductor layer. A dielectric fill material layer is deposited in a remaining volume of the source cavity.

BRIEF DESCRIPTION OF THE DRAWINGS

FIG. 4B is a top-down view of the exemplary structure of FIG. 4A. The plane A-A' is the plane of the vertical cross-section of FIG. 4A.

FIG. 9B is a horizontal cross-sectional view of the exemplary structure along the horizontal plane B-B' of the FIG. 9A. The vertical cross-sectional plane A-A' is the vertical cross-sectional plane of FIG. 9A.

FIG. 10B is a horizontal cross-sectional view of the exemplary structure along the horizontal plane B-B' of the FIG. 10A. The vertical cross-sectional plane A-A' is the vertical cross-sectional plane of FIG. 10A.

DETAILED DESCRIPTION

Figure 1:
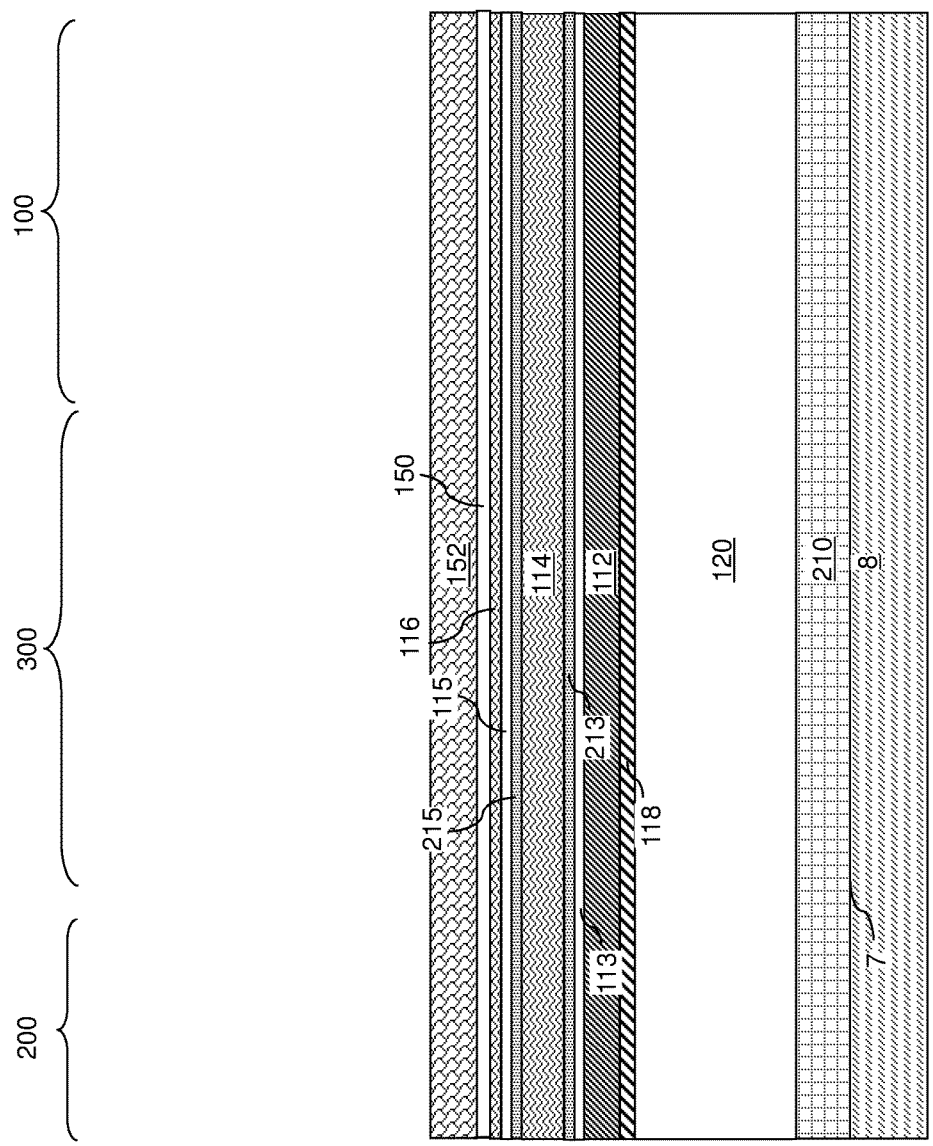
FIG. 1 is a vertical cross-sectional view of an exemplary structure after formation of an optional metallic source layer, a source semiconductor layer, a lower silicon oxide layer, a lower etch stop dielectric layer, a sacrificial semiconductor layer, an upper etch stop dielectric layer, an upper silicon oxide layer, a cap semiconductor layer, a gate dielectric layer, and a doped semiconductor layer according to an embodiment of the present disclosure.

A configuration in which electrical contact between bottom portions of vertical semiconductor channels and a buried source line in a vertical NAND device is referred to as direct source contact. Typically, direct source contact is provided by forming a sacrificial semiconductor layer and replacing the sacrificial semiconductor layer with a doped semiconductor material layer. However, the present inventors realized that voids are formed inside the doped semiconductor material layer due to constriction of reactants path during deposition of the doped semiconductor material layer in a narrow opening. Such voids can move around during a subsequent high temperature thermal treatment, and can cause an electrical open circuit in the doped semiconductor material layer and inducing device failure. In one embodiment of the present disclosure, a method is provided for forming electrical contact to bottom portions of vertical semiconductor channels that has no voids or a reduced amount of voids.

As discussed above, the present disclosure is directed to a three-dimensional memory structure employing discrete source straps with less or no voids for providing direct source contact to vertical semiconductor channels and methods of manufacturing the same, the various aspects of which are described below. The embodiments of the disclosure can be employed to form various structures including a multi-level memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of a field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated. The exemplary structure includes a substrate 8, which can be a semiconductor substrate such as a silicon substrate. The substrate 8 can include a substrate semiconductor layer. The substrate semiconductor layer maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate 8 can have a major surface 7, which can be, for example, a topmost surface of the substrate semiconductor layer. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, semiconductor devices 210 can be optionally formed on the substrate 8. The semiconductor devices 210 can include, for example, field effect transistors including respective source regions, drain regions, channel regions, and gate structures. Shallow trench isolation structures (not expressly shown) can be formed in an upper portion of the semiconductor substrate 8 to provide electrical isolation among the semiconductor devices. The semiconductor devices 210 can include any semiconductor circuitry to support operation of a memory structure to be subsequently formed, which is typically referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer can be optionally formed over the semiconductor devices 210 and/or the substrate 8, which is herein referred to as at least one lower level dielectric layer 120. The at least one lower level dielectric layer 120 functions as a matrix for lower level metal interconnect structures (not explicitly shown) that provide electrical wiring among the various nodes of the semiconductor devices 210 and landing pads for through-memory-level via structures to be subsequently formed. The lower level metal interconnect structures can include various device contact via structures, lower level metal lines, lower level via structures, and lower level topmost metal structures that are configured to function as landing pads for through-memory-level via structures to be subsequently formed.

The exemplary structure can include a memory array region 100, a contact region 300, and an optional peripheral device region 200. An array of memory stack structures can be subsequently formed in the memory array region 100 and over the at least one lower level dielectric layer 120 (if present). Contacts to word lines of the memory stack structures can be subsequently formed in the contact region 300. If present, additional semiconductor devices and/or through-memory-level via structures can be formed in the peripheral device region 200. The semiconductor devices 210 may be present in any, and/or each, of the areas of the memory array region 100, the contact region 300, and the peripheral device region 200. For example, the semiconductor devices 210 may be present in the peripheral device region 200 but not under the memory array region 100 or the contact region 300. The region of the semiconductor devices 210 and the combination of the at least one lower level dielectric layer 120 and the lower level metal interconnect structures embedded therein is herein referred to an underlying peripheral device region, which may be located underneath a memory-level assembly to be subsequently formed and includes peripheral devices for the memory-level assembly. The semiconductor devices 210 and the at least one lower level dielectric layer 120 are optional, and thus, may be omitted.

An optional metallic source layer 108, a source semiconductor layer 112, a lower silicon oxide layer 113, a lower etch stop dielectric layer 213, and a sacrificial semiconductor layer 114 can be sequentially formed over the at least one lower level dielectric layer 120 and/or the substrate 8. The optional metallic source layer 108 includes a metallic material such as an elemental metal (such as tungsten), an intermetallic alloy of at least two elemental metals, a conductive metal nitride (such as TiN), or a metal silicide (such as cobalt silicide, nickel silicide, or tungsten silicide). The optional metallic source layer 108 provides a highly conductive horizontal current path for source electrodes to be subsequently formed. The optional metallic source layer 108 can be formed by a conformal deposition method or a non-conformal deposition method, and can have a thickness in a range from 20 nm to 200 nm, although lesser and greater thicknesses can also be employed.

The source semiconductor layer 112 includes a doped semiconductor material. The dopant concentration of the source semiconductor layer 112 can be in a range from $1.0 \times 10^{19}/\text{cm}^3$ to $2.0 \times 10^{21}/\text{cm}^3$, although lesser and greater dopant concentrations can also be employed. In one embodiment, the source semiconductor layer 112 can include n-doped polysilicon, n-doped amorphous silicon that is converted into n-doped polysilicon in a subsequent processing step (such as an anneal process), or any p-doped or n-doped polycrystalline semiconductor material or any p-doped or n-doped amorphous semiconductor material that can be subsequently converted into a polycrystalline semiconductor material. In one embodiment, the type of doping of the source semiconductor layer 112 can be the same as the type of charge carriers injected into channels of memory stack structures to be subsequently formed. For example, if electrons are injected into the channels of the memory stack structures to be subsequently formed, the source semiconductor layer 112 can be n-doped. Alternatively, if holes are injected into the channels of the memory stack structures to be subsequently formed, the source semiconductor layer 112 can be p-doped. The type of doping of the source semiconductor layer 112 is herein referred to as a first conductivity type. The source semiconductor layer 112 can be deposited by a conformal deposition method (such as chemical vapor deposition) or a non-conformal deposition method. The thickness of the source semiconductor layer 112 can be in a range from 30 nm to 600 nm, although lesser and greater thicknesses can also be employed.

A planar material layer stack (113, 213, 114, 215, 115) is formed over the source semiconductor layer 112. The planar material layer stack (113, 213, 114, 215, 115) includes a stack of planar layers, i.e., a stack of layers located at a respective fixed distance from the horizontal plane including the top surface of the substrate 8. The patterned material layer stack can include, from bottom to top, a lower silicon oxide layer 113, a lower etch stop dielectric layer 213, a sacrificial semiconductor layer 114, an upper etch stop dielectric layer 215, and an upper silicon oxide layer 115.

The lower silicon oxide layer 113 includes doped silicate glass or undoped silicate glass (i.e., silicon oxide). The lower silicon oxide layer 113 can include thermal oxide formed by thermal oxidation of a surface portion of the source semiconductor layer 112, or can include a deposited silicon oxide material that may be formed, for example, by thermal decomposition of a silicon oxide precursor gas (such as tetraethylorthosilicate gas). The lower silicon oxide layer 113 can be deposited by a plasma enhanced chemical vapor deposition (PECVD) or low pressure chemical vapor deposition (LPCVD). The thickness of the lower silicon oxide layer 113, as measured at horizontal portions, can be in a range from 10 nm to 50 nm, although lesser and greater thicknesses can also be employed.

The lower etch stop dielectric layer 213 includes a material that can function as an etch stop material during removal of the sacrificial semiconductor layer 114 that is formed on the lower etch stop dielectric layer 213. In one embodiment, the lower etch stop dielectric layer 213 can include a dielectric metal oxide such as aluminum oxide, hafnium oxide, or lanthanum oxide. Alternatively, the lower etch stop dielectric layer 213 can include silicon nitride or silicon oxide which is denser than the silicon oxide material of the lower silicon oxide layer 113. The lower etch stop dielectric layer 213 can be deposited, for example, by atomic layer deposition (ALD). The thickness of the lower etch stop dielectric layer 213 can be in a range from 2 nm to 30 nm, though lesser and greater thicknesses can also be employed.

The sacrificial semiconductor layer 114 is deposited on the lower etch stop dielectric layer 213. The sacrificial semiconductor layer 114 includes a semiconductor material that can be removed selective to the lower etch stop dielectric layer 213 by an etch process. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. For example, the sacrificial semiconductor layer 114 can include amorphous silicon, an amorphous silicon-germanium alloy, or a polycrystalline semiconductor material. The semiconductor material of the sacrificial semiconductor layer 114 may be intrinsic, p-doped, or n-doped. In one embodiment, the semiconductor material of the sacrificial semiconductor material layer 114 may be deposited without intentional doping with electrical dopants, and may be intrinsic or "lightly doped," i.e., have a doping at a dopant concentration less than $3.0 \times 10^{15}/cm^3$ caused by residual dopants incorporated during a deposition process that does not flow a dopant gas including p-type dopant atoms or n-type dopant atoms. The sacrificial semiconductor layer 114 can be deposited by chemical vapor deposition. The thickness of the sacrificial semiconductor layer 114 can be in a range from 20 nm to 200 nm, although lesser and greater thicknesses can also be employed.

The upper etch stop dielectric layer 215 includes a material that can function as an etch stop material during removal of the sacrificial semiconductor layer 114. In one embodiment, the upper etch stop dielectric layer 215 can include a dielectric metal oxide such as aluminum oxide, hafnium oxide, or lanthanum oxide. In another embodiment, the upper etch stop dielectric layer 215 can include silicon nitride or silicon oxide material which is denser than the silicon oxide material of the upper silicon oxide layer 115. The upper etch stop dielectric layer 215 can be deposited, for example, by atomic layer deposition (ALD). The thickness of the upper etch stop dielectric layer 215 can be in a range from 2 nm to 50 nm, though lesser and greater thicknesses can also be employed. The material of the upper etch stop dielectric layer 215 may be the same as, or may be different from, the material of the lower etch stop dielectric layer 213.

The upper silicon oxide layer 115 includes doped silicate glass or undoped silicate glass (i.e., silicon oxide). The upper silicon oxide layer 115 can include a deposited silicon oxide material that may be formed, for example, by thermal decomposition of a silicon oxide precursor gas (such as tetraethylorthosilicate gas). The upper silicon oxide layer 115 can be deposited by a plasma enhanced chemical vapor deposition (PECVD) or low pressure chemical vapor deposition (LPCVD). The thickness of the upper silicon oxide layer 115, as measured at horizontal portions, can be in a range from 10 nm to 50 nm, although lesser and greater thicknesses can also be employed. The material of the upper silicon oxide layer 115 may be the same as, or may be different from, the material of the lower silicon oxide layer 113.

A cap semiconductor layer 116 can be formed on a top surface of the second silicon oxide layer 115. The cap semiconductor layer 116 can include a semiconductor material layer that can function as an etch stop layer during subsequent etch of the upper silicon oxide layer 115. For example, the cap semiconductor layer 116 can include intrinsic (e.g., not intentionally doped) amorphous silicon, polysilicon, or a silicon-germanium alloy. The thickness of the cap semiconductor layer 116 can be in a range from 10 nm to 40 nm, although lesser and greater thicknesses can also be employed.

A gate dielectric layer 150 and a doped semiconductor layer 152 can be sequentially formed. The gate dielectric layer 150 includes a dielectric material such as silicon oxide, a dielectric metal oxide, or a combination thereof. The thickness of the gate dielectric layer 150 can be in a range from 3 nm to 10 nm, although lesser and greater thicknesses can also be employed. The doped semiconductor layer 152 includes a doped semiconductor material such as n-doped or p-doped amorphous silicon that can be converted into n-doped or p-doped polysilicon in an anneal process. The thickness of the doped semiconductor layer 152 can be in a range from 100 nm to 300 nm, although lesser and greater thicknesses can also be employed. The doped semiconductor layer 152 can be subsequently employed as an etch stop layer during formation of memory openings or backside trenches through an alternating stack of material layers to be subsequently formed.

Figure 2:
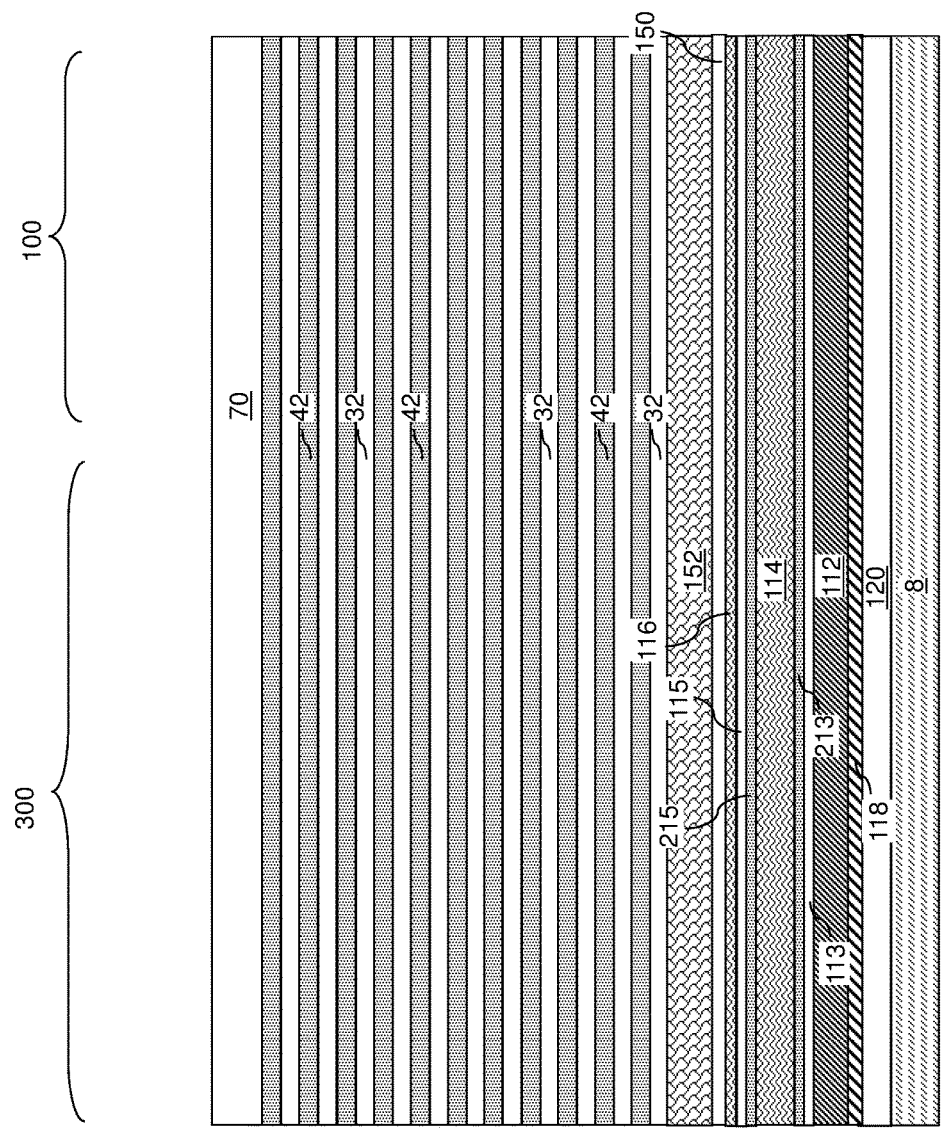
FIG. 2 is a vertical cross-sectional view of the exemplary structure after formation of an alternating stack of insulating layers and sacrificial material layers and a dielectric cap layer according to an embodiment of the present disclosure.

Referring to FIG. 2, a stack of an alternating plurality of first material layers (which can be insulating layers 32) and second material layers (which can be sacrificial material layer 42) is formed over the doped semiconductor layer 152. As used herein, a "material layer" refers to a layer including a material throughout the entirety thereof. Instances of the first material layers may have the same thickness thereamongst, or may have different thicknesses. Instances of the second elements may have the same thickness thereamongst, or may have different thicknesses. Each first material layer includes a first material, and each second material layer includes a second material that is different from the first material. In one embodiment, each first material layer can be an insulating layer 32, and each second material layer can be a sacrificial material layer 42. In this case, an alternating stack (32, 42) of the insulating layers 32 and the sacrificial material layers 42 can be formed over the doped semiconductor layer 152. The levels of the layers in the alternating stack (32, 42) are collectively referred to as levels. The set of all structures formed in the levels is herein referred to as a structure.

Thus, the alternating stack (32, 42) can include the insulating layers 32 composed of the first material, and the sacrificial material layers 42 composed of a second material different from that of the insulating layers 32. The first material of the insulating layers 32 can be at least one insulating material. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and the sacrificial material layers 42 can include silicon nitride. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD). In one embodiment, the materials of the insulating layers 32 and the sacrificial material layers 42 can be selected such that each of the upper and lower etch stop dielectric layers (213, 215) has a different composition than component layers within the alternating stack (32, 42), i.e., the insulating layers 32 and the sacrificial material layers 42. In another embodiment, the upper and lower etch stop dielectric layers (213, 215) have the same composition (e.g., comprise silicon nitride) as the sacrificial material layers 42.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

Generally, the spacer material layers may be formed as, or may be subsequently replaced with, electrically conductive layers. While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

An insulating cap layer 70 can be deposited over the alternating stack (32, 42). The insulating cap layer 70 includes a material different from the material of the sacrificial material layers 42, and can include the same material as the insulating layers 32. For example, the insulating cap layer 70 can include silicon oxide. The thickness of the insulating cap layer 70 can be in a range from 30 nm to 500 nm, although lesser and greater thicknesses can also be employed.

Figure 3:
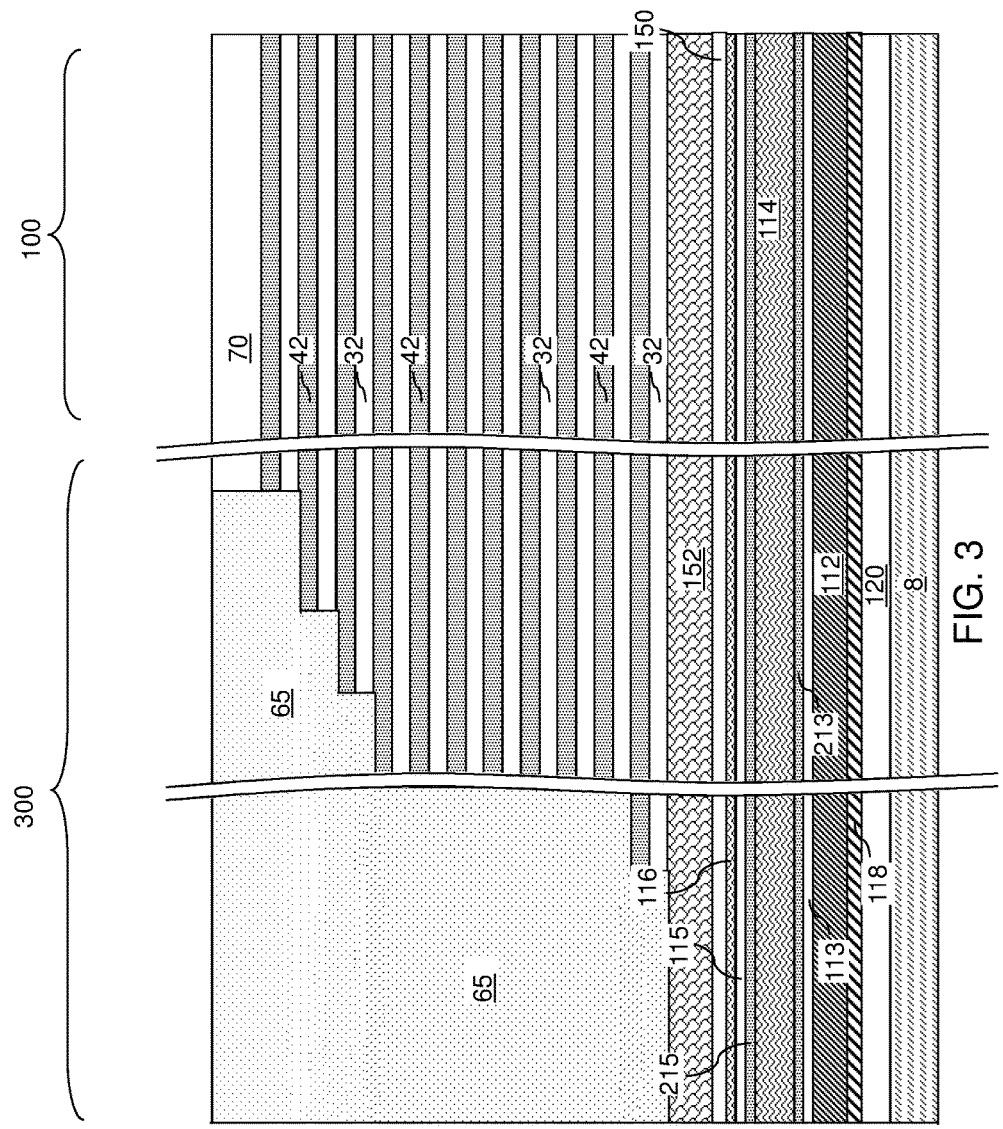
FIG. 3 is a vertical cross-sectional view of the exemplary structure after formation of stepped surfaces and a retro-stepped dielectric material portion according to an embodiment of the present disclosure.

Referring to FIG. 3, a stepped cavity can be formed within the contact region 300 which is located between the memory array region 100 (e.g., memory plane) and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the alternating stack (32, 42), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
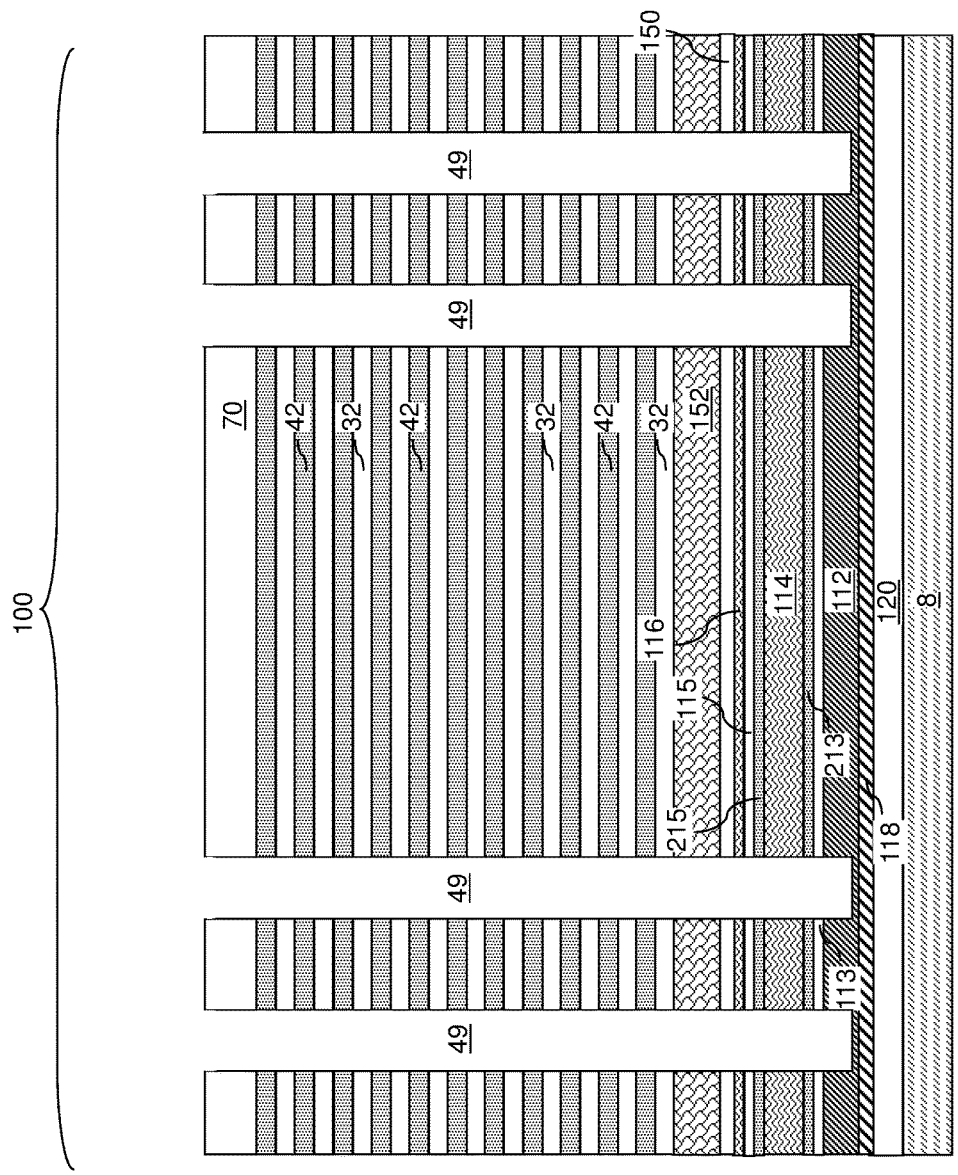
FIG. 4A is a vertical cross-sectional view of a memory array region of the exemplary structure after formation of memory openings according to an embodiment of the present disclosure.
Figure 4C:
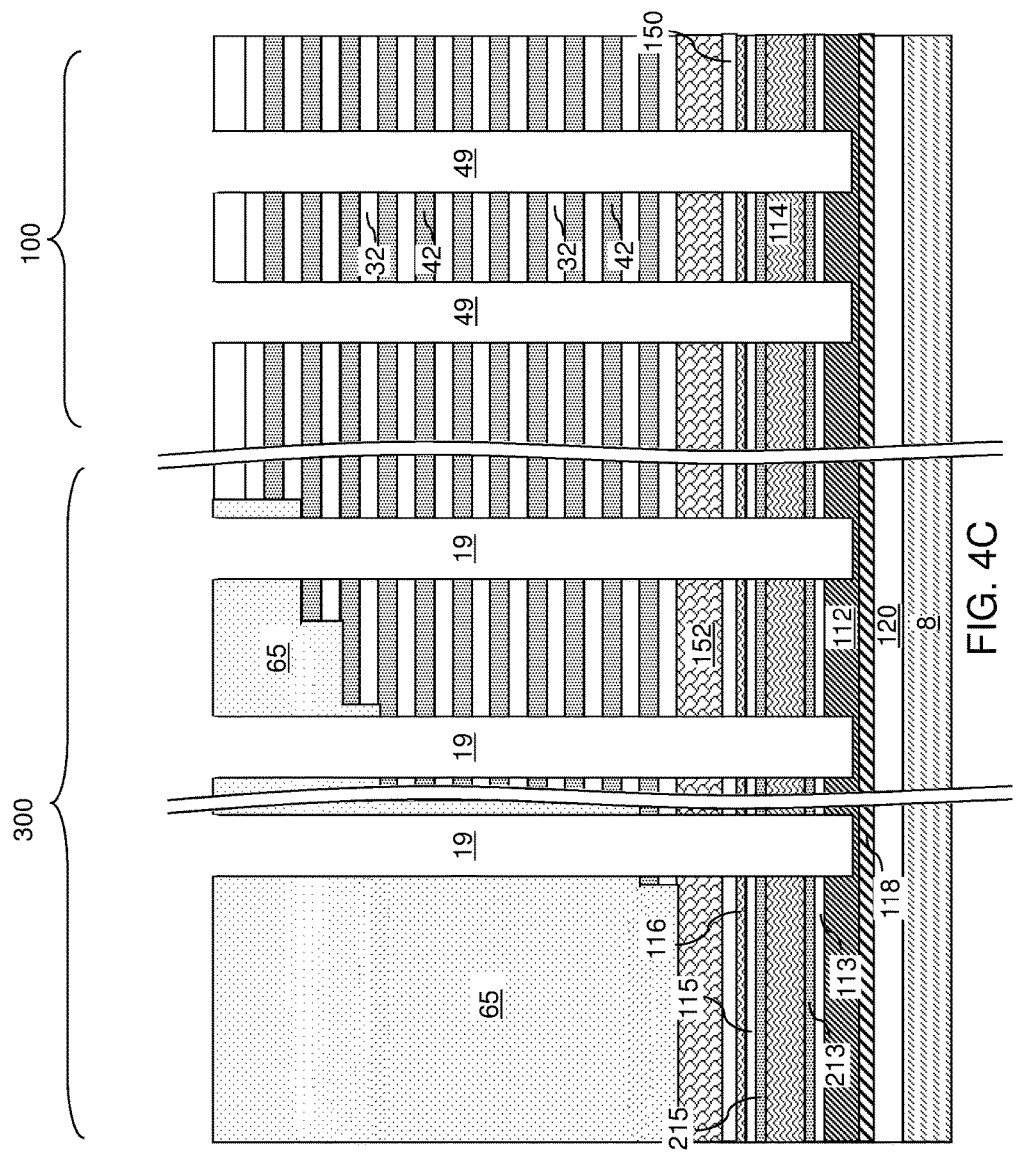
FIG. 4C is another vertical cross-sectional view of the exemplary structure of FIGS. 4A and 4B along a direction that straddles the memory array region and the contact region.

Referring to FIGS. 4A-4C, a lithographic material stack (not shown) including at least a photoresist layer can be formed over the alternating stack (32, 42) and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the retro-stepped dielectric material portion 65 and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42), the doped semiconductor layer 152, and the sacrificial semiconductor layer 114, and into an upper portion of the source semiconductor layer 112. The support openings 19 extend through the retro-stepped dielectric material portion 65, a subset of layers within the alternating stack (32, 42), the doped semiconductor layer 152, and the sacrificial semiconductor layer 114, and into an upper portion of the source semiconductor layer 112. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

Each of the memory openings 49 and the support openings 19 may have vertical sidewalls or tapered sidewalls. A two-dimensional array of memory openings 49 can be formed in the memory array region 100. A two-dimensional array of support openings 19 can be formed in the contact region 300.

Figure 5:
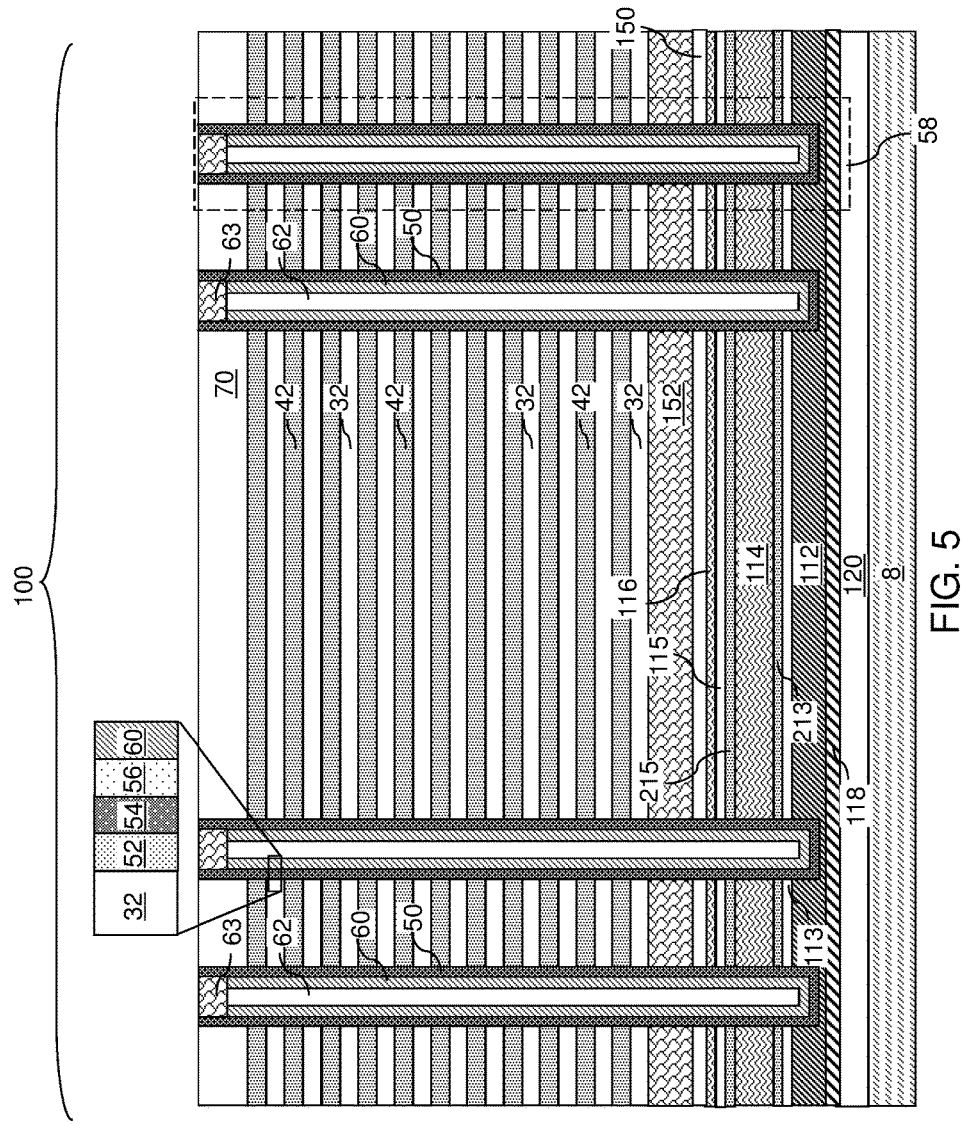
FIG. 5 is a vertical cross-sectional view of the exemplary structure after formation of memory stack structures, dielectric cores, and drain regions according to an embodiment of the present disclosure.

Referring to FIG. 5, each of the memory openings 49 and the support openings 19 is filled with a same set of material portions that is deposited by a same set of processing steps. Each set of material portions that fills a memory opening 49 is herein referred to as a memory opening fill structure 58. Each set of material portions that fills a support opening 19 is herein referred to as a support pillar structure, which has a pillar shape and provides structural support to the exemplary structure during subsequent processing steps. Specifically, a stack of layers including a blocking dielectric layer 52, a charge storage layer 54, a tunneling dielectric layer 56, and a semiconductor channel layer can be sequentially deposited in each of the memory openings 49 and the support openings 19. While FIG. 5 illustrates memory openings 49 and structures formed therein, it is understood that the same, or similar (in case the support openings 19 have different sizes than the memory openings 49) structures are formed in each of the support openings 19.

The blocking dielectric layer 52 can include a single dielectric material layer or a stack of a plurality of dielectric material layers. In one embodiment, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The combination of the blocking dielectric layer 52, the charge storage layer 54, and the tunneling dielectric layer 56 is herein referred to as a memory film 50.

The semiconductor channel layer includes a semiconductor material that is employed to form semiconductor channels 60. The semiconductor channel layer includes at least one semiconductor material that may include at least one elemental semiconductor material, at least one III-V compound semiconductor material, at least one II-VI compound semiconductor material, at least one organic semiconductor material, or other semiconductor materials known in the art. In one embodiment, the semiconductor channel layer includes amorphous silicon or polysilicon. The semiconductor channel layer can be formed by a conformal deposition method such as low pressure chemical vapor deposition (LPCVD). The thickness of the semiconductor channel layer can be in a range from 2 nm to 10 nm, although lesser and greater thicknesses can also be employed. A memory cavity may be present in the volume of each memory opening 49 that is not filled with the deposited material layers (52, 54, 56, 60).

A dielectric fill material can be deposited to fill the memory cavities (i.e., unfilled volumes) within the memory openings 49 and the support openings 19. The dielectric fill material can include, for example, silicon oxide or organosilicate glass. The material can be deposited by a conformal deposition method such as low pressure chemical vapor deposition (LPCVD), or by a self-planarizing deposition process such as spin coating. The dielectric fill material and the memory film 50 can be removed from above the top surface of the insulating cap layer 70 by a planarization process, which can include a recess etch process and/or chemical mechanical planarization (CMP) process. A remaining portion of the memory film 50 is present within each memory opening 49. A remaining portion of the semiconductor channel layer is present within each memory opening 49 and constitutes a semiconductor channel 60. A remaining portion of the dielectric fill material is present within each memory opening 49, and is herein referred to as a dielectric core 62.

The dielectric core 62 can be vertically recessed below a horizontal plane including the top surface of the insulating cap layer 70 prior to, during, or after removal of the horizontal portions of the memory film 50 from above the horizontal plane including the top surface of the insulating cap layer 70. Subsequently, a doped semiconductor material having a doping of the first conductivity type can be deposited within the recessed volumes overlying the dielectric cores 62 inside the memory openings 49 to form drain regions 63. For example, the drain regions 63 can include n-doped polysilicon or n-doped amorphous silicon that can be converted into n-doped polysilicon in a subsequent anneal process.

Each combination of a memory film 50 and a semiconductor channel 60 within a memory opening 49 constitutes a memory stack structure (50, 60). The memory stack structure (50, 60) is a combination of a semiconductor channel 60, a tunneling dielectric layer 56, a plurality of memory elements as embodied as portions of the charge storage layer 54, and an blocking dielectric layer 52. Each combination of a memory stack structure (50, 60), a dielectric core 62, and a drain region 63 within a memory opening 49 constitutes a memory opening fill structure 58. The same combination can be formed within each support opening to provide support pillar structured in the contact region 300. The support pillar structures are electrically inactive structures that provide structural support during subsequent replacement of the sacrificial material layers 42 and the sacrificial semiconductor layer 114.

Thus, each memory stack structure (50, 60) includes a semiconductor channel 60 and a memory film 50 laterally surrounding the vertical semiconductor channel 60. An array of memory opening fill structures 58 can extend through each of the at least one alternating stack (32, 42) and into an upper portion of the source semiconductor layer 112.

Figure 6:
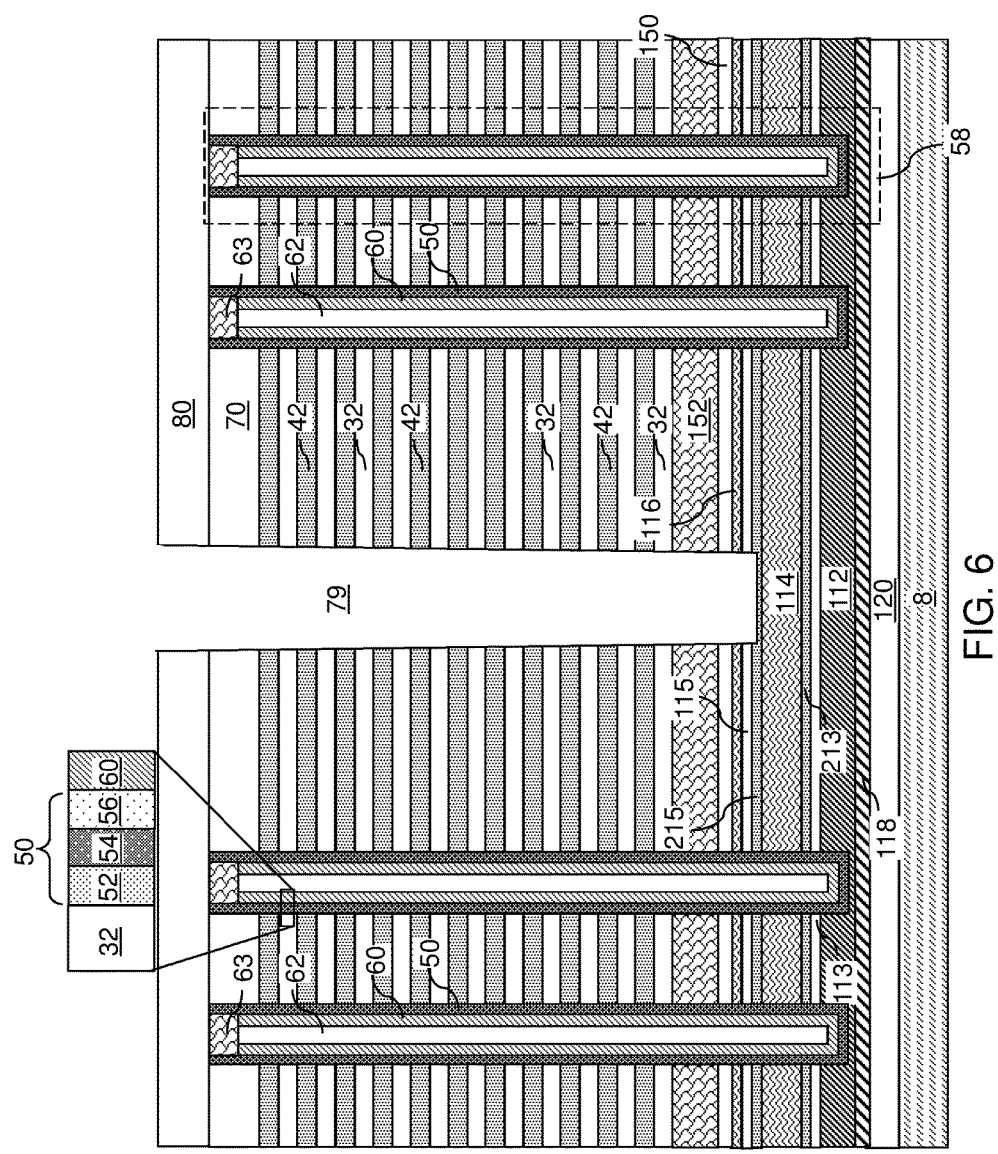
FIG. 6 is vertical cross-sectional view of the exemplary structure after formation of a backside trench according to an embodiment of the present disclosure.

Referring to FIG. 6, a contact level dielectric layer 80 can be optionally formed over the insulating cap layer 70. The contact level dielectric layer 80 includes a dielectric material that is different from the dielectric material of the sacrificial material layers 42. For example, the contact level dielectric layer 80 can include silicon oxide. The contact level dielectric layer 80 can have a thickness in a range from 50 nm to 500 nm, although lesser and greater thicknesses can also be employed.

A photoresist layer (not shown) can be applied over the contact level dielectric layer 80, and can be lithographically patterned to form openings in areas between clusters (e.g., blocks) of memory opening fill structures 58. The pattern in the photoresist layer can be transferred through the contact level dielectric layer 80, the at least one alternating stack (32, 42) and/or the at least one retro-stepped dielectric material portion 65 employing an anisotropic etch to form backside trenches 79. The backside trenches 79 vertically extend from the top surface of the contact level dielectric layer 80, through the alternating stack (32, 42), the doped semiconductor layer 152, the gate dielectric layer 150, the cap semiconductor layer 116, and to one of the upper silicon oxide layer 115 and the upper etch stop dielectric layer 215. In one embodiment, one of the upper silicon oxide layer 115 and the upper etch stop dielectric layer 215 can be employed as an etch stop layer during formation of the backside trenches 79. The backside trenches 79 can be formed between clusters (e.g., blocks) of memory opening fill structures 58. The photoresist layer can be removed, for example, by ashing.

Figure 7:
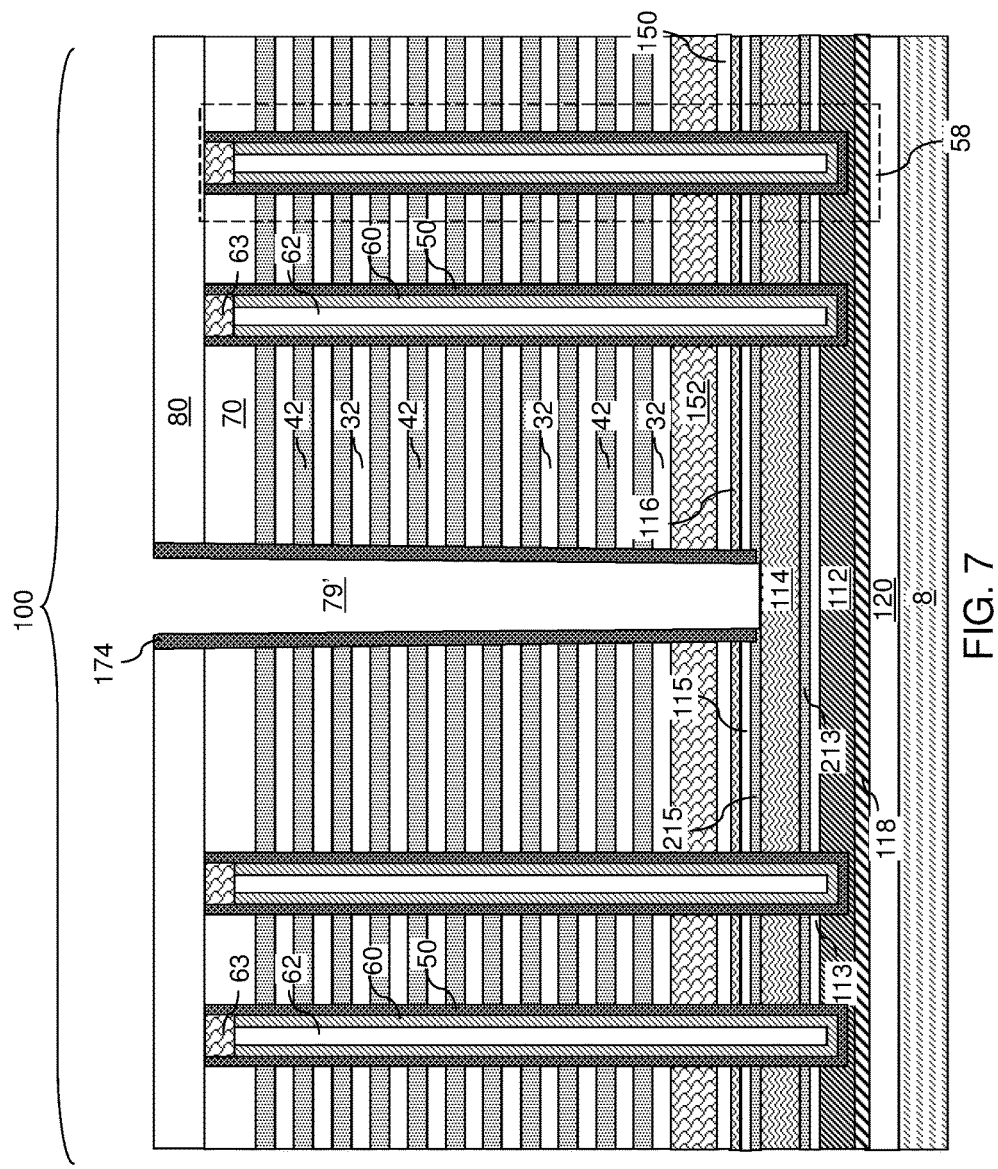
FIG. 7 is a vertical cross-sectional view of the exemplary structure after formation of a trench spacer according to an embodiment of the present disclosure.

Referring to FIG. 7, a trench spacer 174 can be formed on the sidewalls of each backside trench 79 by deposition of a conformal material layer and an anisotropic etch. The trench spacer 174 includes a material that is resistant to an etchant to be subsequently employed to etch the sacrificial semiconductor layer 114. For example, the trench spacer 174 can include silicon nitride. The thickness of the trench spacer 174 can be in a range from 10 nm to 30 nm, although lesser and greater thicknesses can also be employed. A trench cavity 79' can be located inside a trench spacer 174 within each backside trench 79. The anisotropic etch can be extended after formation of the trench spacer 174 in each backside trench 79 to remove underlying portions of the upper silicon oxide layer 115, if present, and the upper etch stop dielectric layer 215. A top surface of the sacrificial semiconductor layer 114 is physically exposed at the bottom of each backside trench 79.

Figure 8:
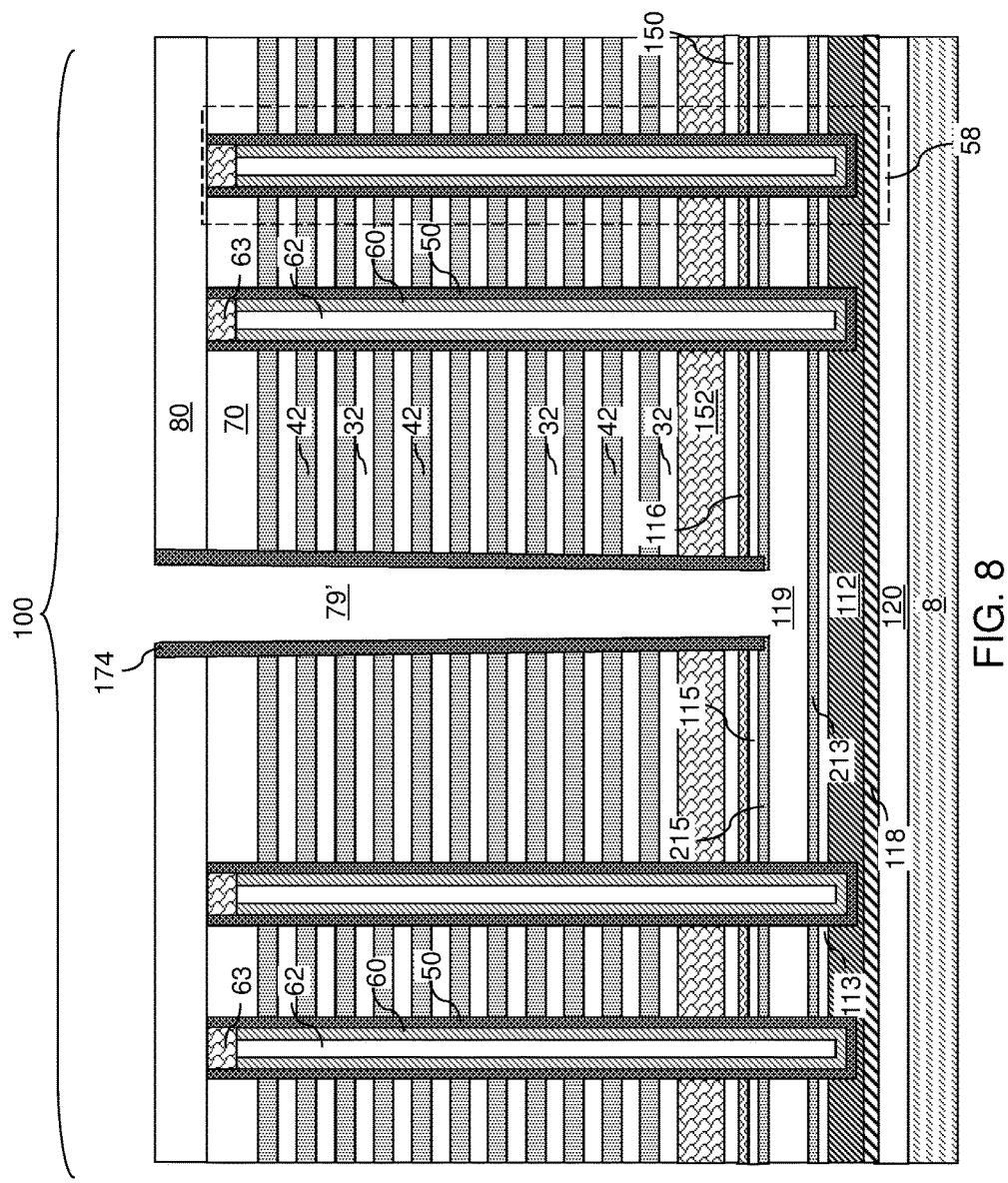
FIG. 8 is a vertical cross-sectional view of the exemplary structure after formation of a source cavity according to an embodiment of the present disclosure.

Referring to FIG. 8, a first isotropic etch process can be performed employing an etchant that etches the material of the sacrificial semiconductor layers 114 selective to the lower etch stop dielectric layer 213, the upper etch stop dielectric layer 215, and the trench spacers 174. The etchant can be introduced through the backside trenches 79. The etchant can be a liquid phase etchant applied in a wet etch process, or a gas phase etchant applied in a dry etch process. In an illustrative example, the sacrificial semiconductor layer 114 includes amorphous silicon, the lower and upper etch stop dielectric layers (213, 215) can include a respective dielectric metal oxide (such as aluminum oxide), silicon nitride or dense silicon oxide, and the trench spacers 174 can include silicon nitride. In this case, a wet etch process employing a trimethyl-2 hydroxyethyl ammonium hydroxide (TMY) solution, a wet etch process employing a KOH solution, or other wet etch processes employing tetramethyl ammonium hydroxide (TMAH), SC-1 (e.g., aqueous ammonium hydroxide and hydrogen peroxide), or $NH_4OH$ solutions, or a dry etch process employing gas phase HCl may be employed to isotropically etch that sacrificial semiconductor layer 114. Each memory film 50 can include a material layer that is not etched by the etchant of the first isotropic etch process. For example, each memory film 50 can include a blocking dielectric layer 52 including a silicon oxide material that is resistant to the etchant of the first isotropic etch process. The sacrificial semiconductor layer 114 can be completely removed. A source cavity 119 can be formed by removal of the sacrificial semiconductor layer 114. Thus, the first isotropic etch process isotropically etches the material of the sacrificial semiconductor layer 114 selective to the upper and lower etch stop dielectric layers (213, 215) and a layer within each memory film 50.

Figure 9A:
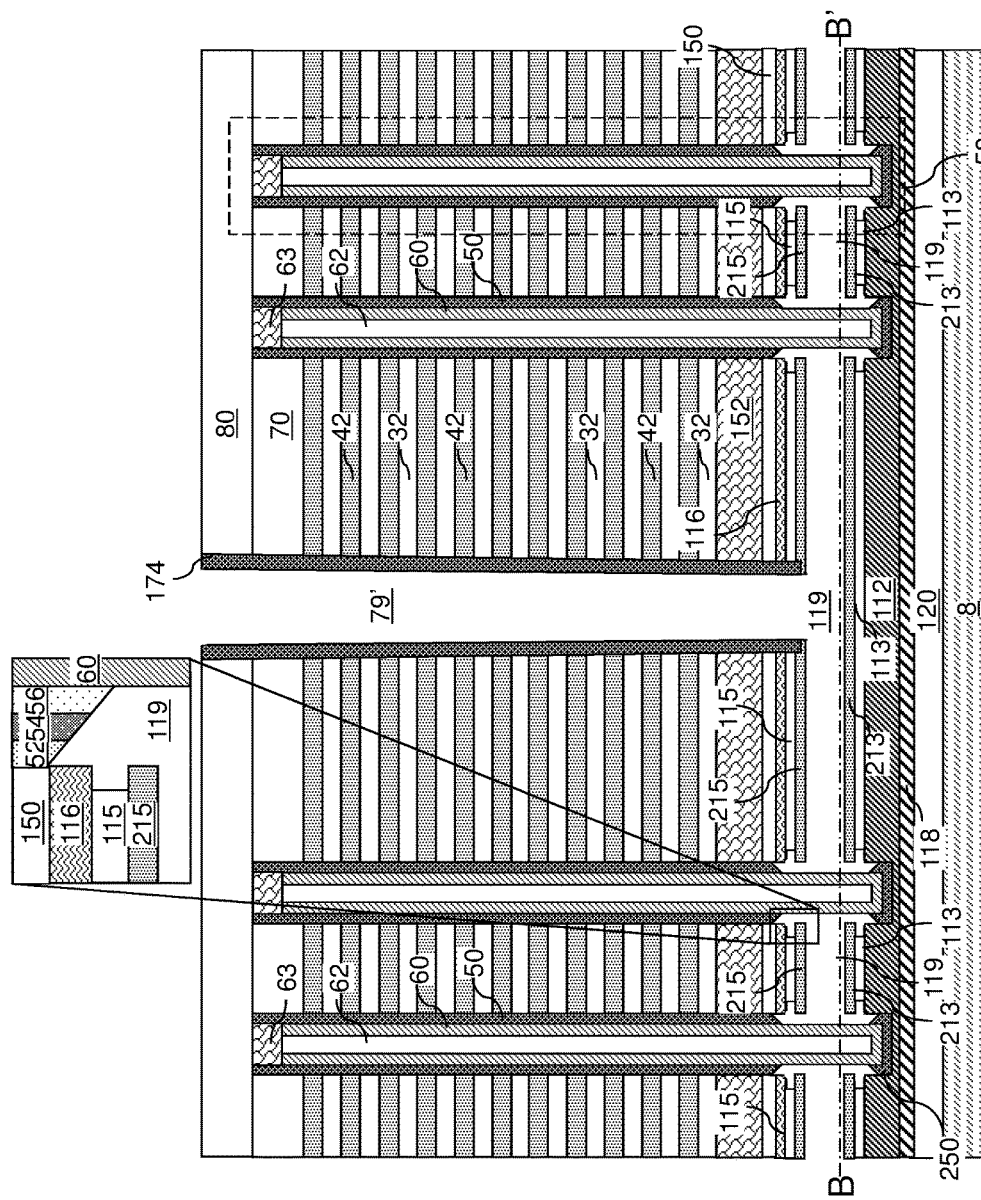
FIG. 9A is a vertical cross-sectional view of the exemplary structure after removal of physically exposed portions of memory films according to an embodiment of the present disclosure.

Referring to FIGS. 9A and 9B, physically exposed portions of memory films 50 are removed at the level of the source cavity 119. Specifically, a second isotropic etch process can be performed by introducing at least another etchant through the backside trenches 79 into the source cavities 119. The second isotropic etch process removes materials of the memory films 50 selective to the materials of the lower and upper etch stop dielectric layers (213, 215) and the semiconductor channels 60. For example, the second isotropic etch process can include a first etch step that etches the material of the blocking dielectric layer 52, a second etch step that etches the material of the charge storage layer 54, and a third etch stop that etches the material of the tunneling dielectric layer 56. In an illustrative example, the blocking dielectric layer 52 can include silicon oxide, the charge storage layer 54 can include silicon nitride, and the tunneling dielectric layer 56 can include silicon oxide or an ONO stack. In this case, the first etch step can include a wet etch or a vapor phase etch employing hydrofluoric acid, the second etch step can employ a wet etch employing hot phosphoric acid, and the third etch step can employ another etch step employing hydrofluoric acid. If the etch stop dielectric layers (213, 215) and the trench spacer 174 both comprise silicon nitride, then the trench spacer 174 and the etch stop dielectric layers are preferably made thicker than the silicon nitride charge storage layer 54 such that the etch stop dielectric layers (213, 215) and the trench spacer 174 are not completely removed during the timed etch which completely removes the charge storage region 54 in the source cavity 119. If the etch stop dielectric layers (213, 215) comprise silicon oxide which is denser than the silicon oxide of the blocking dielectric 52, the tunneling dielectric 56, the lower and upper silicon oxide layers (113, 115) and the insulating layers 32, then the blocking dielectric and the tunneling dielectric can be etched using chemical dry etching selectively to denser etch stop dielectric layers (213, 215). The source cavity 119 is expanded by removal of portions of the memory films 50 from the level of the source cavity 119, i.e., the level from which the sacrificial material layer 114 is removed.

In one embodiment, the duration of the first etch step can be prolonged after outer surfaces of the charge storage layers 54 are physically exposed to extend the volume of the source cavity 119 vertically around each memory opening fill structure 58. Specifically, the blocking dielectric layer 52 can be etched in the vertical direction perpendicular to the top surface 7 of the substrate 8, i.e., upward to physically expose the upper silicon oxide layer 115, and downward to physically expose the lower silicon oxide layer 113. The etchant of the first etch step etches the silicon oxide materials of the lower silicon oxide layer 113 and the upper silicon oxide layer 115 around each memory opening fill structure 58. In one embodiment, the source cavity 119 can vertically extend above the horizontal plane including the top surface of the upper silicon oxide layer 115, and below the horizontal plane including the bottom surface of the lower silicon oxide layer 113.

The second etch step can etch the physically exposed portions of the charge storage layer 54, and the outer sidewalls of the tunneling dielectric layers 56 can be physically exposed. The third etch step etches the physically exposed portions of the tunneling dielectric layer 56 to physically expose outer surfaces of each semiconductor channel 60 at the level of the source cavity 119. The third etch step can further etch the materials of the lower and upper silicon oxide layers (113, 115). The charge storage layer 54 and the tunneling dielectric layer 56 may also be etched in the vertical direction as discussed above to create a larger opening.

A bottom portion of each memory film 50 can be separated from a respective remaining upper portion of the memory film 50 to form a memory material cap portion 250 that underlies a respective vertical semiconductor channel 60. Each of the memory films 50 and the memory material cap portions 250 comprises a stack including, from one side to another, a blocking dielectric layer 52, a charge storage layer 54, and a tunneling dielectric layer 56.

The first etch step and the third etch step can etch the materials of the lower and upper silicon oxide layers (113, 1115) to form undercut regions around each memory opening fill structure 58 at the levels of the lower silicon oxide layer 113 and the upper silicon oxide layer 115. Specifically, the lower silicon oxide layer 113 can be laterally undercut from underneath the lower etch stop dielectric layer 213 during removal of portions of the memory films 50 that physically exposes cylindrical sidewalls of the vertical semiconductor channels 60. Further, the upper silicon oxide layer 115 can be laterally undercut from above the upper etch stop dielectric layer 215 during removal of the portions of the memory films 50. Thus, a lower undercut region at the level of the lower silicon oxide layer 113 and an upper undercut region at the level of the upper silicon oxide layer 115 can be formed around each memory opening fill structure 58 by the second isotropic etch process.

Surfaces of the source semiconductor layer 112 are physically exposed in each lower undercut region. The physically exposed surfaces of the source semiconductor layer 112 around each memory opening fill structure 58 include an annular top surface portion and a cylindrical sidewall surface portion of the source semiconductor layer 112. Further, surfaces of the cap semiconductor layer 116 are physically exposed in each upper undercut region. The physically exposed surfaces of the cap semiconductor layer 116 around each memory opening fill structure 58 include an annular bottom surface portion and a cylindrical sidewall surface portion of the cap semiconductor layer 116. Thus, the second isotropic etch process that isotropically etches the memory film selective to the upper and lower etch stop dielectric layers (213, 215) forms the undercut regions in which surfaces of the source semiconductor layer 112 and the cap semiconductor layer 116 can be physically exposed. Each of the upper and lower etch stop dielectric layers (213, 215) can have a different composition than component layers within the alternating stack (32, 42). In an illustrative example, each of the upper and lower etch stop dielectric layers (213, 215) can include aluminum oxide, the insulating layers 32 can include silicon oxide, and the sacrificial material layers 42 can include silicon nitride. Alternatively, each of the upper and lower etch stop dielectric layers (213, 215) can include silicon nitride or a dense silicon oxide.

Figure 10A:
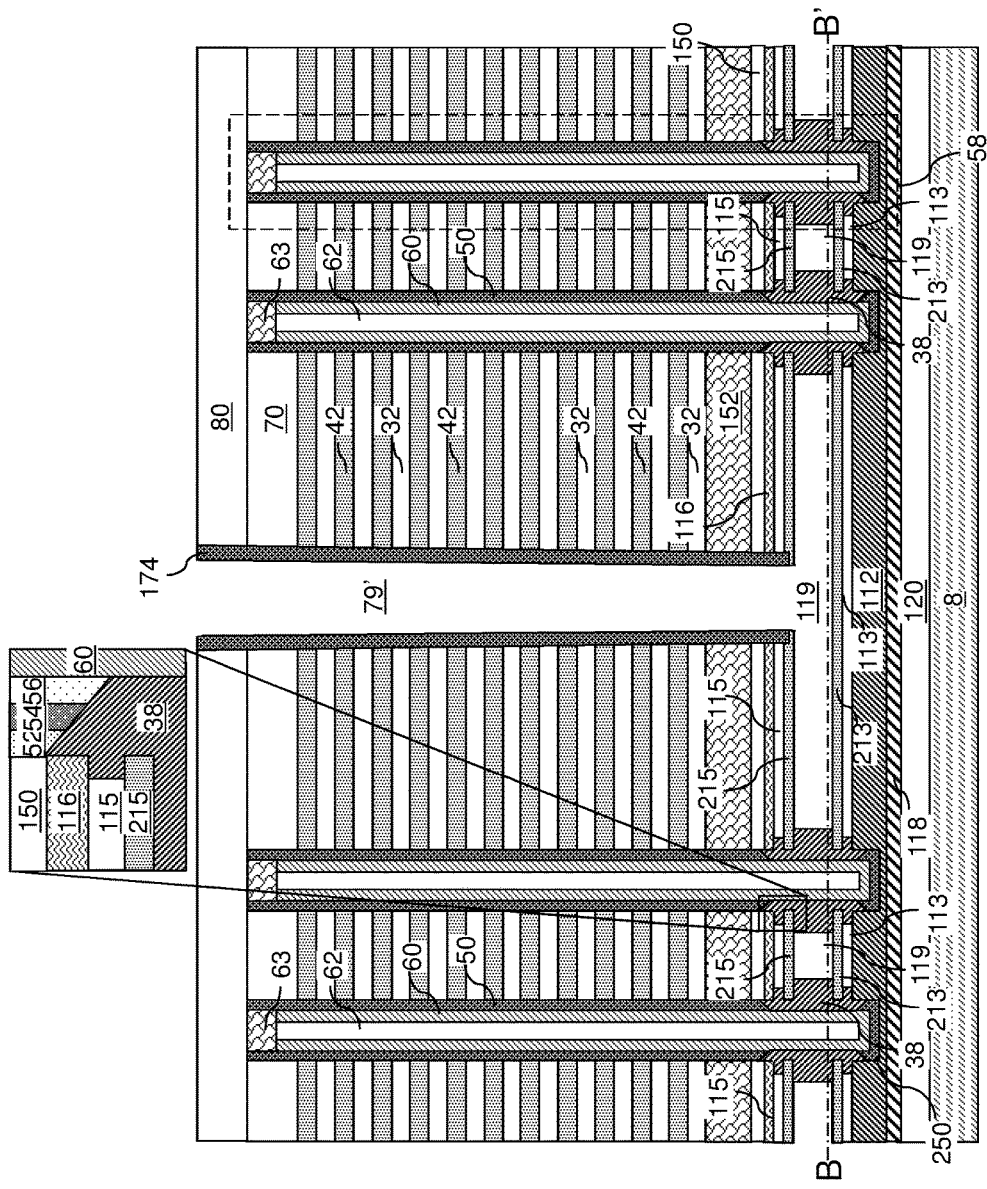
FIG. 10A is a vertical cross-sectional view of the exemplary structure after formation of source strap structures according to an embodiment of the present disclosure.

Referring to FIGS. 10A and 10B, discrete source strap structures 38 can be formed around a respective one of the vertical semiconductor channels 60 and on physically exposed surfaces of the source semiconductor layer 112 by a selective semiconductor deposition process. The selective semiconductor deposition process deposits a doped semiconductor material having a doping of a same conductivity type as the source semiconductor layer 112. In one embodiment, the doped semiconductor material that is deposited by the selective semiconductor deposition process can be heavily doped to provide a conductive semiconductor material, i.e., a doped semiconductor material having electrical conductivity greater than $1.0 \times 10^5$ S/cm.

A selective semiconductor deposition process is a deposition process in which a reactant for depositing a semiconductor material and an etchant that etches the semiconductor material are concurrently or alternately flowed into a process chamber such that the etch rate of the semiconductor material provided by the etchant is between the higher growth rate of the semiconductor material on semiconductor surfaces and the lower growth rate (or the nucleation rate) of the semiconductor material on dielectric surfaces. A net deposition of the semiconductor material occurs only on the semiconductor surfaces, and the semiconductor material does not grow from the dielectric surfaces. A dopant can be flowed concurrently with the reactant for deposition of the semiconductor material to provide in-situ doping of the deposited semiconductor material. The deposited semiconductor material may be polycrystalline if the underlying semiconductor surfaces are polycrystalline or amorphous, or single crystalline (epitaxial) or polycrystalline if the underlying semiconductor surfaces are single crystalline.

The doped semiconductor material can grow directly from the physically exposed outer sidewall surfaces of the vertical semiconductor channels 60, the physically exposed surfaces of the source semiconductor layer 112, and the physically exposed surfaces of the cap semiconductor layer 116. The doped semiconductor material can have a doping of the first conductivity type, i.e., the same conductivity type as the conductivity type of the source semiconductor layer 112. For example, if the source semiconductor layer 112 includes an n-doped semiconductor material, the deposited doped semiconductor material is also n-doped.

Semiconductor material portions including the deposited doped semiconductor material grow around each memory opening fill structure 58 at the level of the source cavity 119. The portions of the doped semiconductor material that grow from each physically exposed surface of the source semiconductor layer 112 or the cap semiconductor layer 116 merge with a doped semiconductor material portion that grows from the most proximal vertical semiconductor channel 60, i.e., the vertical semiconductor channel 60 that is surrounded by the portions of the doped semiconductor material. Thus, a single cylindrical portion of the deposited semiconductor material is formed directly on each vertical semiconductor channel 60. In one embodiment, the selective semiconductor deposition process terminates without merging of deposited semiconductor material portions that are grown from different vertical semiconductor channels 60. The discrete cylindrical doped semiconductor material portions that laterally surround, and contact, a respective one of the vertical semiconductor channels 60 is herein referred to as a discrete source strap structure 38. Thus, the selective semiconductor deposition process that grows the doped semiconductor material from semiconductor surfaces and not from dielectric surfaces forms the discrete source strap structures 38.

Each discrete source strap structure 38 contacts, and laterally surrounds, a respective one of the vertical semiconductor channels 60 of the memory stack structures (50, 60), and contacts the source semiconductor layer 112. The discrete source strap structures 38 provide electrically conductive paths between the source semiconductor layer 112 and bottom sidewall portions of the semiconductor channels 60. In one embodiment, each of the discrete source strap structures 38 contacts one of the vertical semiconductor channels 60 and the source semiconductor layer 112.

In one embodiment, the growth of the doped semiconductor material from the sidewalls of the vertical semiconductor channels 60 can proceed to a greater lateral extent than the lateral extent of the undercut regions from the sidewalls of the vertical semiconductor channels 60. In this case, each of the discrete source strap structures 38 can have a greater lateral thickness at the level of the source cavity 119 than at levels of the upper etch stop dielectric layer 215 and the lower etch stop dielectric layer 213. The discrete source strap structures 38 are laterally grown from the sidewalls of the vertical semiconductor channels 60. Since a narrow opening of the source cavity 119 is not constricting the reactants path, the occurrence of voids in the source strap structures 38 is reduced or eliminated.

Each of the memory films 50 can have a lateral thickness that is defined between an outer sidewall and a most proximal portion of an inner sidewall. The collateral erosion of the lower etch stop dielectric layer 213 and the upper etch stop dielectric layer 215 during the first and second isotropic etch processes may be negligible. In this case, the lateral separation distance between each vertical semiconductor channel 60 and the lower etch stop dielectric layer 213 can be the same as the lateral thickness of the memory film 50, and lateral separation distance between each vertical semiconductor channel 60 and the upper etch stop dielectric layer 215 can be the same as the lateral thickness of the memory film 50. In other words, the lateral separation distance between each of the vertical semiconductor channels 60 and each of the upper and lower etch stop dielectric layers (215, 213) can be the same as the lateral thickness of each of the memory films 50.

Each discrete source strap structure 38 fills a respective lower undercut region located at the level of the lower silicon oxide layer 113 and a respective upper under region located at the level of the upper silicon oxide layer 115. Each memory material cap portion 250 underlies, and contacts, a respective one of the discrete source strap structures 38. Each memory material cap portion 250 is embedded within the source semiconductor layer 112.

In one embodiment, a space exists between each neighboring pair of discrete source strap structures 38. This space is utilized in a subsequent processing step to deposit a dielectric material therein. The dielectric material that laterally encapsulates the discrete source strap structures 38 prevents diffusion of the semiconductor material of the discrete source strap structures 38 in a subsequent high temperature process such as an activation anneal process.

Figure 11:
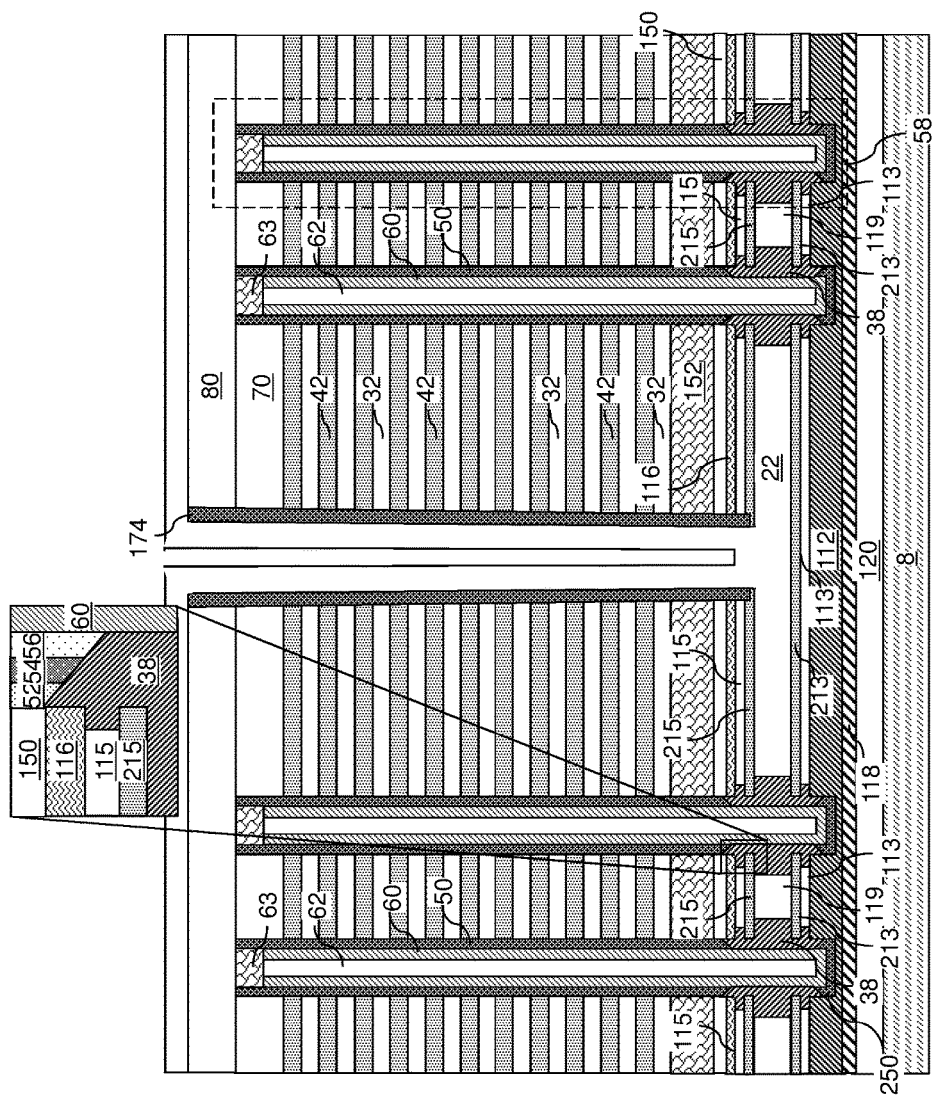
FIG. 11 is a vertical cross-sectional view of the exemplary structure after deposition of a dielectric fill material layer according to an embodiment of the present disclosure.

Referring to FIG. 11, a dielectric fill material layer 22 can be deposited in the remaining volume of the source cavity 119, peripheral portions of each backside trench 79, and over the top surface of the contact level dielectric layer 80. The dielectric fill material layer 22 can be deposited by a conformal deposition method such as chemical vapor deposition (CVD). The dielectric fill material layer 22 includes a dielectric material such as undoped silicate glass or doped silicate glass. In one embodiment, the upper and lower etch stop dielectric layers (215, 213) comprise a dielectric metal oxide, and the dielectric fill material layer 22 comprises silicon oxide.

Figure 12A:
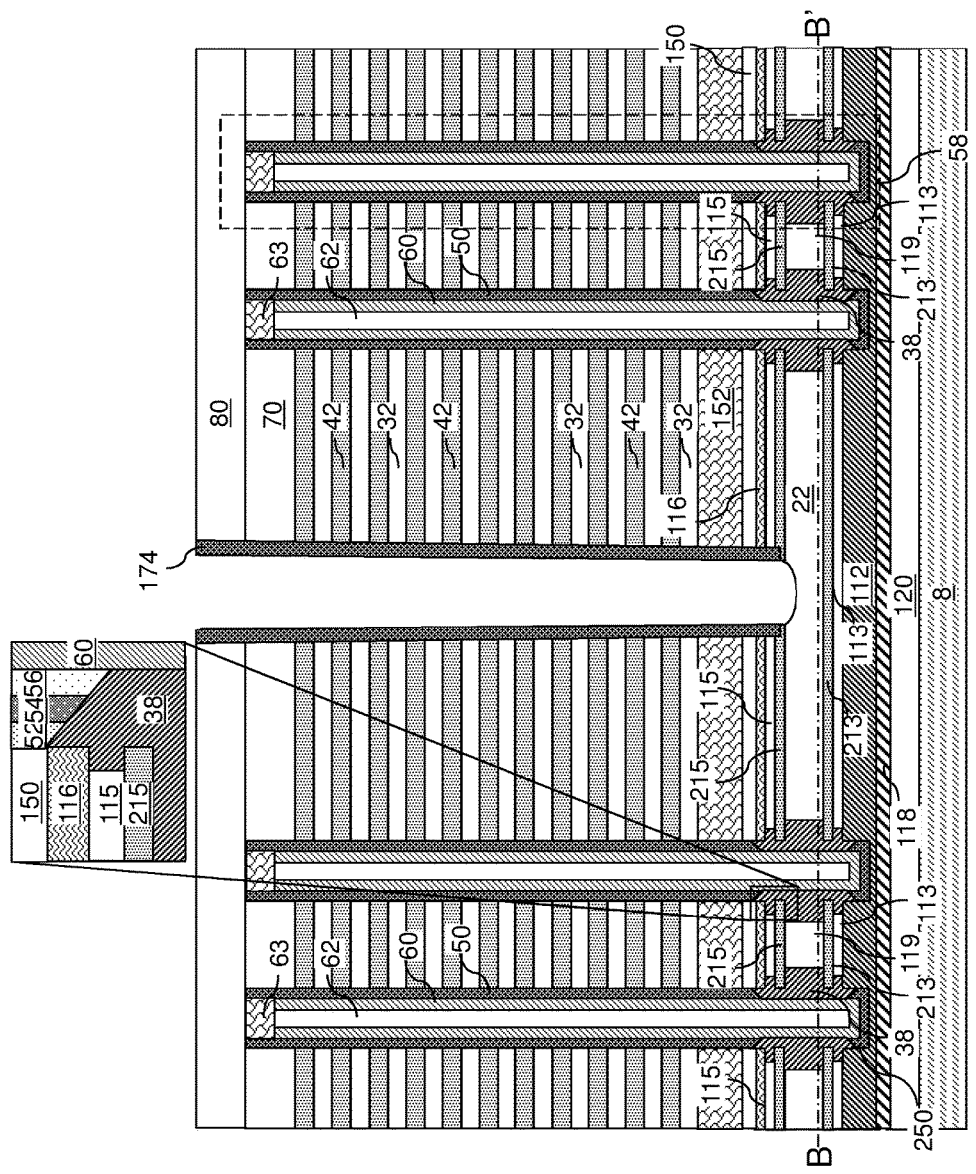
FIG. 12A is a vertical cross-sectional view of the exemplary structure after recessing the dielectric fill material layer according to an embodiment of the present disclosure.
Figure 12B:
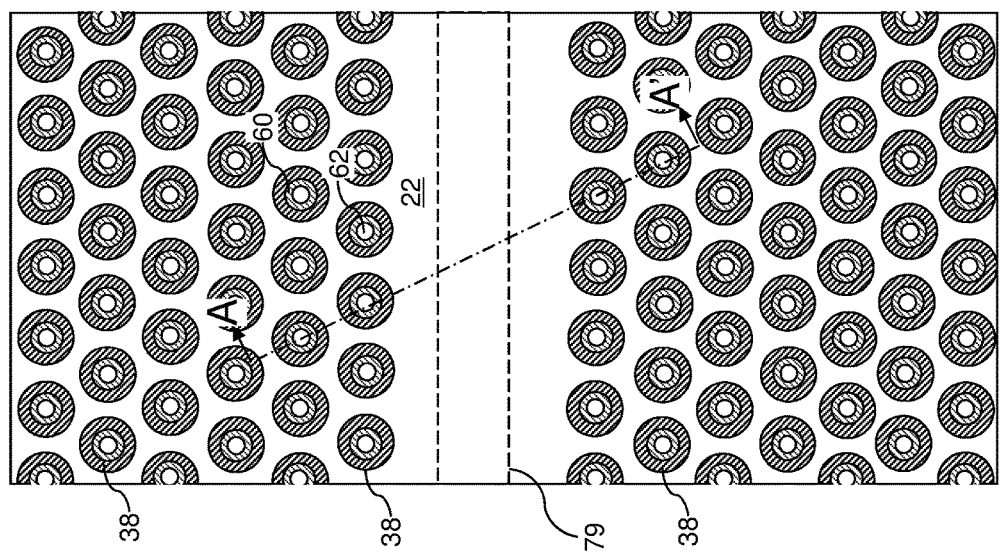
FIG. 12B is a horizontal cross-sectional view of the exemplary structure along the horizontal plane B-B' of the FIG. 12A. The vertical cross-sectional plane A-A' is the vertical cross-sectional plane of FIG. 12A.

Referring to FIGS. 12A and 12B, the dielectric fill material layer 22 can be isotropically etched back. Portions of the dielectric fill material layer 22 overlying the contact level dielectric layer 80 or located inside the backside trenches 79 are removed, while the portions of the dielectric fill material layer 22 filling a volume of the source cavity 119 remains. A dielectric material layer stack (113, 213, 22, 215, 213) is formed, which overlies the source semiconductor layer 112 and comprises, from bottom to top, the lower silicon oxide layer 113, the lower etch stop dielectric layer 213, the dielectric fill material layer 22, the upper etch stop dielectric layer 215, and the upper silicon oxide layer 115.

The discrete source strap structures 38 are physically spaced from one another by the dielectric fill material layer 22. The dielectric fill material layer 22 laterally surrounds, and directly contacts, an outer sidewall of each of the discrete source strap structures 38. Due to formation of the undercuts during the second isotropic etch process, the lower silicon oxide layer 113 is laterally spaced farther from each of the vertical semiconductor channels 60 than a minimum separation distance between the lower etch stop dielectric layer 213 and the vertical semiconductor channels 60. Likewise, the upper silicon oxide layer 115 is laterally spaced farther from each of the vertical semiconductor channels 60 than a minimum separation distance between the upper etch stop dielectric layer 215 and the vertical semiconductor channels 60. In one embodiment, the dielectric fill material layer 22 can include a concave top surface underneath the backside trench 79.

Figure 13:
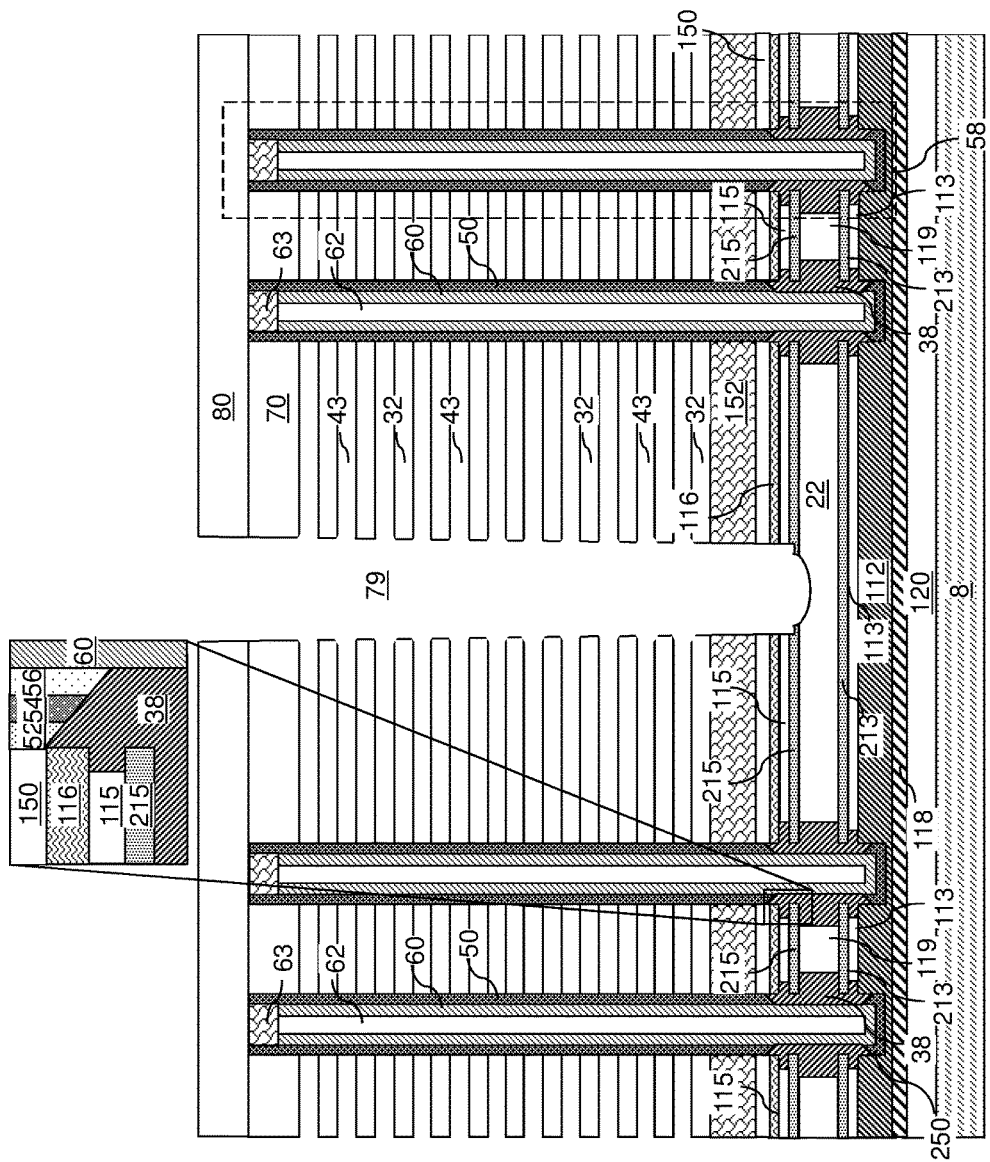
FIG. 13 is a vertical cross-sectional view of the exemplary structure after formation of backside recesses according to an embodiment of the present disclosure.

Referring to FIG. 13, the trench spacer 174 and the sacrificial material layers 42 are removed selective to the insulating layers 32, the insulating cap layer 70, the contact level dielectric layer 80, and the dielectric fill material layer 22. For example, an etchant that selectively etches the second material of the sacrificial material layers 42 with respect to the first material of the insulating layers 32 can be introduced into the backside trenches 79 employing an isotropic etch process such as a wet etch process. If the trench spacer 174 includes the same material as the sacrificial material layers 42, the trench spacer 174 can be removed in the same etch process as the etch process employed to remove the sacrificial material layers 42. If the trench spacer 174 includes a different material than the sacrificial material layers 42, the trench spacer 174 may be removed by an isotropic etch prior to removal of the sacrificial material layers 42. In an illustrative example, if the trench spacer 174 and the sacrificial material layers 42 include silicon nitride, a wet etch employing hot phosphoric acid can be employed to remove the trench spacer 174 and the sacrificial material layers 42.

Backside recesses 43 are formed in volumes from which the sacrificial material layers 42 are removed. The removal of the second material of the sacrificial material layers 42 can be selective to the first material of the insulating layers 32, the material of retro-stepped dielectric material portion 65, the material of the outermost layer of the memory films 50 (e.g., the blocking dielectric layer 52), and the semiconductor materials of the doped semiconductor layer 152 and the cap semiconductor layer 116. In one embodiment, the sacrificial material layers 42 can include silicon nitride, and the materials of the insulating layers 32 and the retro-stepped dielectric material portion 65 can include silicon oxide materials.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The memory opening fill structures 58 in the memory array region 100, the support pillar structure provided in the contact region 300, and the retro-stepped dielectric material portion 65 can provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings. Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout.

Figure 14:
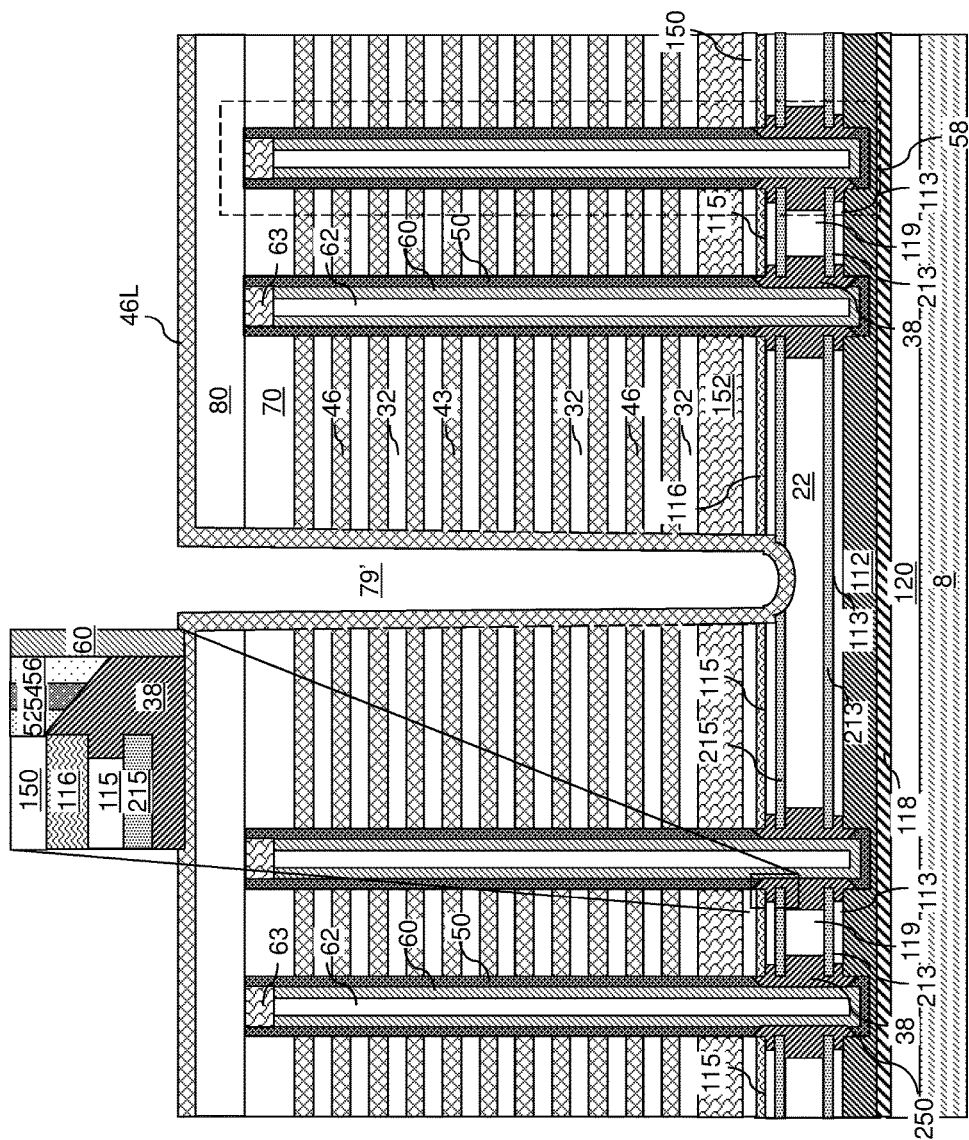
FIG. 14 is a vertical cross-sectional view of the exemplary structure after deposition of at least one conductive material to form electrically conductive layers and a continuous metallic material layer according to an embodiment of the present disclosure.

Referring to FIG. 14, a backside blocking dielectric layer (not shown) can be optionally formed as a continuous material layer in the backside recesses 43 and the backside trenches 79 and over the contact level dielectric layer 80. The backside blocking dielectric layer, if present, comprises a dielectric material that functions as a control gate dielectric for the control gates to be subsequently formed in the backside recesses 43. At least one metallic material can be subsequently deposited in the backside recesses 43 and the backside trenches 79. For example, a combination of a metallic barrier layer (which may include a conductive metallic nitride material such as TiN, TaN, WN, or a stack thereof) and at least one metal fill material layer (such as a tungsten layer) can be deposited by conformal deposition processes such as chemical vapor deposition (CVD) or atomic layer deposition (ALD). A plurality of electrically conductive layers 46 can be formed in the plurality of backside recesses 43, and a continuous metallic material layer 46L can be formed on the sidewalls of each backside trench 79 and over the contact level dielectric layer 80. Each electrically conductive layer 46 includes a portion of the metallic barrier layer and a metallic fill material portion. Thus, each sacrificial material layer 42 can be replaced with an electrically conductive layer 46. A backside cavity 79' is present in the portion of each backside trench 79 that is not filled with the backside blocking dielectric layer and the continuous metallic material layer 46L.

Figure 15:
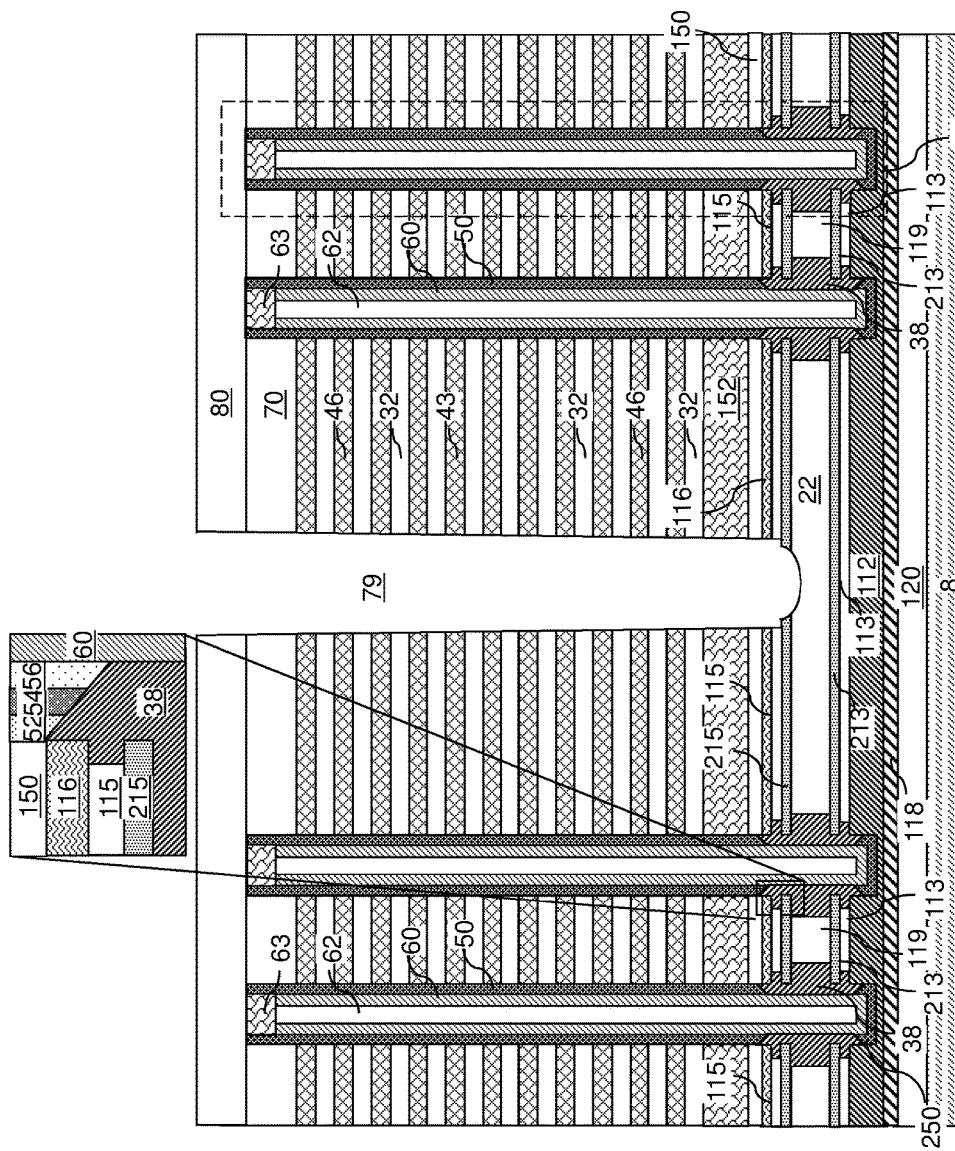
FIG. 15 is a vertical cross-sectional view of the exemplary structure after removal of the deposited at least one conductive material from inside the backside trench according to an embodiment of the present disclosure.

Referring to FIG. 15, the deposited metallic material of the continuous electrically conductive material layer 46L is etched back from the sidewalls of each backside trench 79 and from above the contact level dielectric layer 80, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 can include the control gate electrodes for the vertical memory devices including the memory opening fill structures 58. In other words, each electrically conductive layer 46 can be a word line that functions as a common control gate electrode for the plurality of vertical memory devices. One or more of the uppermost electrically conductive layers 46 can function as a drain select gate of a vertical NAND string, while the doped semiconductor layer 152 can function as a source select gate of the vertical NAND string.

Figure 16A:
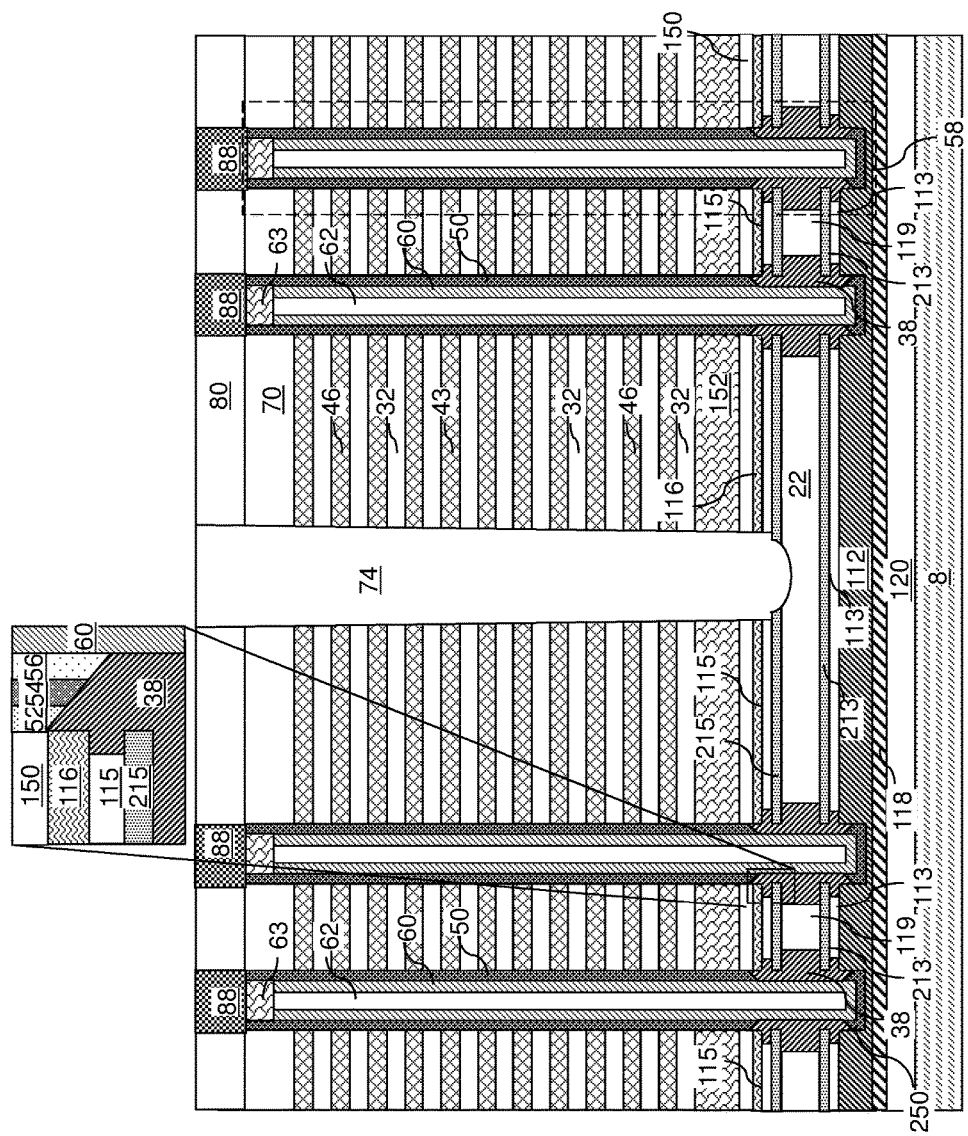
FIG. 16A is a vertical cross-sectional view of a memory array region of the exemplary structure after formation of various contact via structures according to an embodiment of the present disclosure.
Figure 16B:
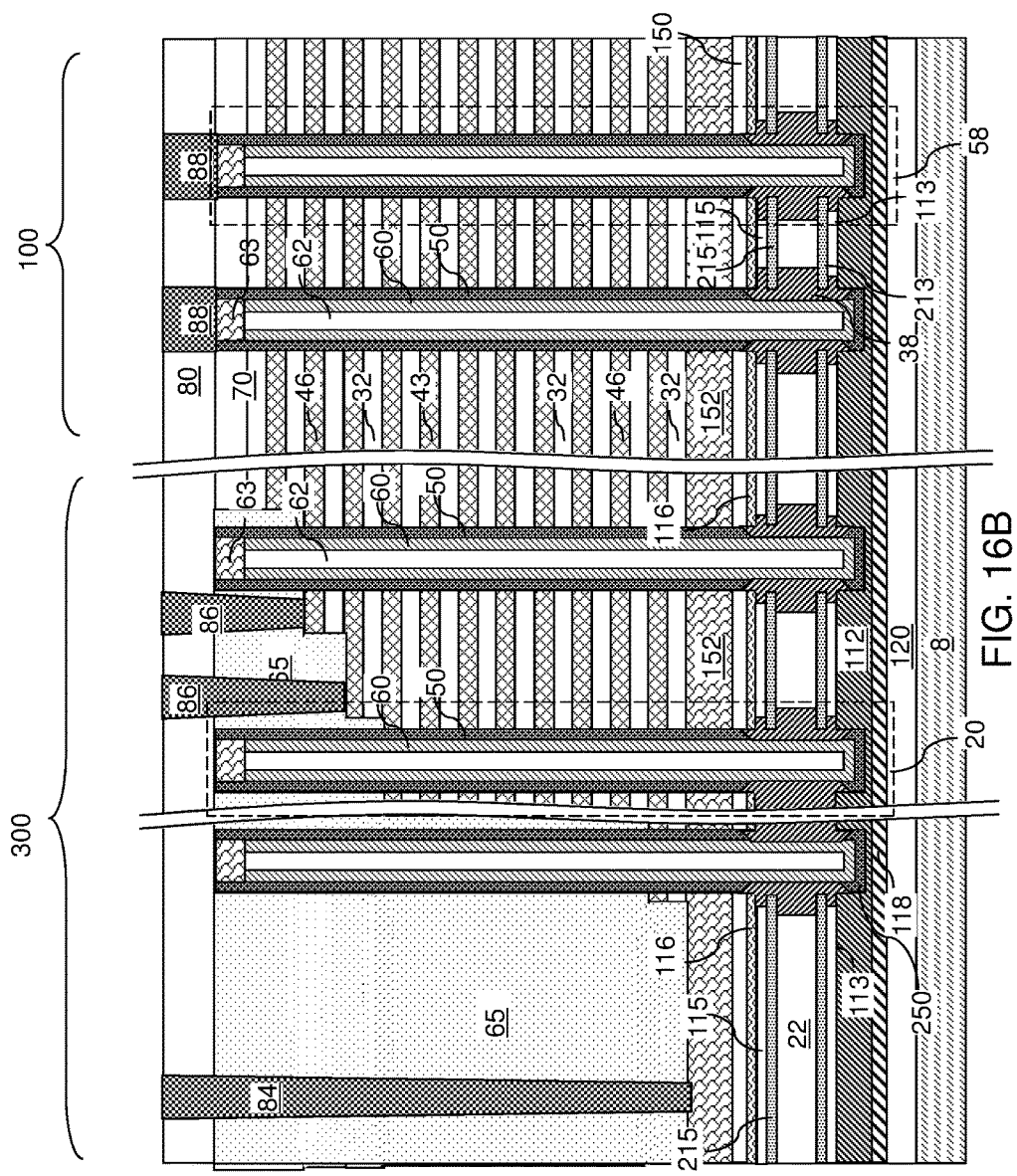
FIG. 16B is a vertical cross-sectional view of a contact region of the exemplary structure after the processing steps of FIG. 16A.

Referring to FIGS. 16A and 16B, an insulating material (such as silicon oxide) can be deposited in the backside cavities 79' to form a dielectric wall structure 74 in each backside trench 79. Excess portions of the insulating material overlying the contact level dielectric layer 80 may, or may not, be removed. Each dielectric wall structure 74 contacts sidewalls of the insulating layers 32 and the electrically conductive layers 46 and top surfaces of the dielectric fill material layer 22. In one embodiment, the dielectric wall structure 74 can include a convex bottom surface that contacts a concave top surface of the dielectric fill material layer 22.

Contact via structures (88, 86) can be formed through the contact level dielectric layer 80, and through the retro-stepped dielectric material portions 65. For example, drain contact via structures 88 can be formed through the contact level dielectric layer 80 on each drain region 63. Word line contact via structures 86 can be formed on the electrically conductive layers 46 through the contact level dielectric layer 80, and through the retro-stepped dielectric material portions 65. Additionally, peripheral device contact via structures (not shown) can be formed through the retro-stepped dielectric material portions 65 on respective nodes of the peripheral devices directly and/or through the various lower level metal interconnect structures within the at least one lower level dielectric layer 120. Support pillar structures 20 can be interspersed among the word line contact via structures 86, as shown in FIG. 16B.

The exemplary structure can include three-dimensional memory device. The three-dimensional memory device can include: a source semiconductor layer 112 comprising a doped semiconductor material and located over a substrate 8; a dielectric material layer stack overlying the source semiconductor layer 112 and comprising, from bottom to top, a lower etch stop dielectric layer 213, a dielectric fill material layer 22, and an upper etch stop dielectric layer 215; an alternating stack (32, 46) of electrically conductive layers 46 and insulating layers 32 located over the dielectric material layer stack; an array of memory stack structures (50, 60) that extend through the alternating stack (32, 46) and into an upper portion of the source semiconductor layer 112, each memory stack structure (50, 60) including a vertical semiconductor channel 60 and a memory film 50 laterally surrounding the vertical semiconductor channel 60. A bottom end of each memory film 50 terminates above a horizontal plane including a top surface of the upper etch stop dielectric layer 215. Discrete source strap structures 38 contact, and laterally surround, a respective one of the vertical semiconductor channels 60 of the memory stack structures (50, 60) and contacting the source semiconductor layer 112.

In one embodiment, the discrete source strap structures 38 are physically spaced from one another by the dielectric fill material layer 22. In one embodiment, each of the discrete source strap structures 38 contacts one of the vertical semiconductor channels 60 and the source semiconductor layer 112. In one embodiment, each of the discrete source strap structures 38 has a greater lateral thickness at a level of the dielectric fill material layer 22 than at levels of the upper etch stop dielectric layer 215 and the lower etch stop dielectric layer 213.

In one embodiment, each of the memory films 50 has a lateral thickness that is defined between an outer sidewall and a most proximal portion of an inner sidewall, and a lateral separation distance between each of the vertical semiconductor channels 60 and each of the upper and lower etch stop dielectric layers (215, 213) is the same as the lateral thickness of each of the memory films 50. In one embodiment, the dielectric fill material layer 22 laterally surrounds, and directly contacts, an outer sidewall of each of the discrete source strap structures 38. In one embodiment, the upper and lower etch stop dielectric layers (215, 213) comprise a dielectric metal oxide, and the dielectric fill material layer 22 comprises silicon oxide.

In one embodiment, the dielectric material layer stack further comprises a lower silicon oxide layer 113 located underneath the lower etch stop dielectric layer 213, and the lower silicon oxide layer 113 is laterally spaced farther from each of the vertical semiconductor channels 60 than a separation distance between the lower etch stop dielectric layer 213 and the vertical semiconductor channels 60. The three-dimensional memory device can further comprise memory material cap portions 250 that underlie, and contact, each of the discrete source strap structures 38. The material cap portions 250 are embedded within the source semiconductor layer 112. In one embodiment, each of the memory films 50 and the memory material cap portions 250 comprises a stack including, from one side to another, a blocking dielectric layer 52, a charge storage layer 54, and a tunneling dielectric layer 56.

The three-dimensional memory device can further comprise a dielectric wall structure 74 located inside a backside trench 79 vertically extending through the alternating stack (32, 46) and including a convex bottom surface that contacts a concave top surface of the dielectric fill material layer 22. The doped semiconductor layer 152 can be employed as a source select electrode that activates a selected set of vertical semiconductor channels 60. In this case, the three-dimensional memory device can include a source select electrode that comprises the doped semiconductor layer 152, located between the alternating stack (32, 46) and the dielectric material layer stack, and laterally surrounding each of the memory stack structures (50, 60).

Each of the exemplary structures of the present disclosure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate 8 can comprise a silicon substrate. The vertical NAND memory device can comprise an array of monolithic three-dimensional NAND strings over the silicon substrate. At least one memory cell (containing a portion of a charge storage layer 54 at a level of an electrically conductive layer 46) in a first device level of the array of monolithic three-dimensional NAND strings can be located over another memory cell (containing another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. For example, the semiconductor devices 210 (illustrated in FIG. 1) can be employed as the integrated circuit including the driver circuit. The electrically conductive layers 46 can comprise a plurality of control gate electrodes having a strip shape extending substantially parallel to the top surface of the substrate 8, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion of each of the plurality of semiconductor channels 60 extends substantially perpendicular to a top surface of the substrate 8; and a plurality of charge storage elements (as embodied as charge trapping material portions). Each charge storage element can be located adjacent to a respective one of the plurality of semiconductor channels 60.

The exemplary structure of the present disclosure provides electrical connection between the source semiconductor layer 112 and the vertical semiconductor channels 60 by forming the discrete source strap structures 38. The discrete source strap structures 38 are cavity free or include less cavities than the prior art structures. The discrete source strap structures 38 are not adjoined to any cavity because the material of the dielectric fill material layer 22 is formed on the outer sidewalls of the discrete source strap structures 38. The semiconductor material of the discrete source strap structures 38 does not diffuse to form cavities during subsequent high temperature treatment such as an activation anneal. Thus, the discrete source strap structures 38 can provide robust electrical connection between the source semiconductor layer 112 and the vertical semiconductor channels 60.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A three-dimensional memory device comprising:
    a source semiconductor layer comprising a doped semiconductor material and located over a substrate;
    a dielectric material layer stack overlying the source semiconductor layer and comprising, from bottom to top, a lower dielectric layer, a dielectric fill material layer, and an upper dielectric layer;
    an alternating stack of electrically conductive layers and insulating layers located over the dielectric material layer stack;
    an array of memory stack structures that extend through the alternating stack and into an upper portion of the source semiconductor layer, each memory stack structure including a vertical semiconductor channel and a memory film laterally surrounding the vertical semiconductor channel, wherein a bottom end of each memory film terminates above a horizontal plane including a top surface of the upper dielectric layer; and discrete source strap structures, wherein each of the discrete source strap structures contacts, and laterally surrounds, a respective one of the vertical semiconductor channels of the memory stack structures and contacts the source semiconductor layer.

2. The three-dimensional memory device of claim 1, wherein the discrete source strap structures are physically spaced from one another by the dielectric fill material layer.

3. The three-dimensional memory device of claim 1, wherein each of the discrete source strap structures has a greater lateral thickness at a level of the dielectric fill material layer than at levels of the upper dielectric layer and the lower dielectric layer.

4. The three-dimensional memory device of claim 1, wherein:

each of the memory films has a lateral thickness that is defined between an outer sidewall and a most proximal portion of an inner sidewall; and a lateral separation distance between each of the vertical semiconductor channels and each of the upper and lower dielectric layers is the same as the lateral thickness of each of the memory films.

5. The three-dimensional memory device of claim 1, wherein the dielectric fill material layer laterally surrounds, and directly contacts, an outer sidewall of each of the discrete source strap structures.

6. The three-dimensional memory device of claim 1, wherein:

the upper and lower dielectric layers comprise a dielectric metal oxide; and the dielectric fill material layer comprises silicon oxide.

7. The three-dimensional memory device of claim 1, wherein:

the dielectric material layer stack further comprises a lower silicon oxide layer located underneath the lower dielectric layer and an upper silicon oxide layer located over the upper dielectric layer; and the lower silicon oxide layer is laterally spaced farther from each of the vertical semiconductor channels than a minimum separation distance between the lower dielectric layer and the vertical semiconductor channels.

8. The three-dimensional memory device of claim 1, further comprising memory material cap portions that underlie, and contact, each of the discrete source strap structures, wherein the memory material cap portions are embedded within the source semiconductor layer.

9. The three-dimensional memory device of claim 8, wherein each of the memory films comprises a stack including, from one side to another, a blocking dielectric layer, a charge storage layer, and a tunneling dielectric layer.

10. The three-dimensional memory device of claim 1, further comprising:

a dielectric wall structure vertically extending through the alternating stack and including a convex bottom surface that contacts a concave top surface of the dielectric fill material layer; and a source select electrode that comprises a doped semiconductor layer located between the alternating stack and the dielectric material layer stack, and laterally surrounding each of the memory stack structures.

11. The three-dimensional memory device of claim 1, wherein:

the three-dimensional memory device comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings; and the silicon substrate contains a peripheral device region comprising an integrated circuit comprising a driver circuit for the memory device located thereon.

12. The three-dimensional memory device of claim 1, wherein the discrete source strap structures do not directly contact one another.

13. The three-dimensional memory device of claim 12, wherein each of the discrete source structures contacts a different one of the vertical semiconductor channels.

* * * * *